US012782395B2

(12) United States Patent
Hu et al.

(10) Patent No.: US 12,782,395 B2
(45) Date of Patent: Nov. 3, 2026

(54) MEMBRANE PROBE CARD, METHOD OF MAKING THE SAME AND METHOD OF MAKING TESTED SEMICONDUCTOR CHIP BY USING THE SAME

(71) Applicant: MPI CORPORATION, Chu-Pei City (TW)

(72) Inventors: Yu-Shan Hu, Chu-Pei City (TW); Shao-Lun Wei, Chu-Pei City (TW); Yu-Wen Wang, Chu-Pei City (TW); Hao-Yu Chung, Chu-Pei City (TW)

(73) Assignee: MPI CORPORATION, Chu-Pei City (TW)

( * ) Notice: Subject to any disclaimer, the term of this patent is extended or adjusted under 35 U.S.C. 154(b) by 176 days.

(21) Appl. No.: 18/637,836

(22) Filed: Apr. 17, 2024

(65) Prior Publication Data

US 2024/0361355 A1 Oct. 31, 2024

Related U.S. Application Data

(60) Provisional application No. 63/462,942, filed on Apr. 28, 2023.

(30) Foreign Application Priority Data

Feb. 19, 2024 (TW) ................................ 113105817

(51) Int. Cl.
*G01R 1/073* (2006.01)
*G01R 1/067* (2006.01)
(Continued)

(52) U.S. Cl.
CPC ....... *G01R 1/0735* (2013.01); *G01R 1/06733* (2013.01); *G01R 3/00* (2013.01); *H01R 43/16* (2013.01)

(58) Field of Classification Search
None
See application file for complete search history.

(56) References Cited

U.S. PATENT DOCUMENTS 12,248,004 B2 * 3/2025 Zhao .................. G01R 1/06716
2014/0327463 A1 11/2014 Tago et al.
(Continued)

FOREIGN PATENT DOCUMENTS

EP 0 838 685 A2 4/1998
EP 2 012 131 A1 1/2009
(Continued)

*Primary Examiner* — Jermele M Hollington
(74) *Attorney, Agent, or Firm* — Birch, Stewart, Kolasch & Birch, LLP

(57) ABSTRACT

A membrane probe card includes probes each having a base electrically connected with a trace of a membrane wiring structure, and a probe tip protruding from the base. The base has a tip placement section and an extension section, which extend from a first side edge to a second side edge of the base in order. The probe tip is made by laser processing and electroplating, located at the tip placement section, and provided with a fixed end portion connected with the base in a way that the width of the tip placement section is greater than the width of the fixed end portion. A distance from a center of the probe tip to the first side edge is less than a distance from the center of the probe tip to the second side edge. As such, requirements of fine pitch and probe height may be achieved.

10 Claims, 21 Drawing Sheets

(51) Int. Cl.
*G01R 3/00* (2006.01)
*H01R 43/16* (2006.01)

(56) References Cited

U.S. PATENT DOCUMENTS

| | | | | |
|---|---|---|---|---|
| 2017/0261544 | A1 | 9/2017 | Amponsah | |
| 2022/0312583 | A1 | 9/2022 | Hu et al. | |
| 2022/0349919 | A1 | 11/2022 | Hu et al. | |
| 2026/0050009 | A1* | 2/2026 | Haba .................. | G01R 1/06727 |
| 2026/0063669 | A1* | 3/2026 | Lin .................... | G01R 1/07342 |

FOREIGN PATENT DOCUMENTS

| | | | | | |
|---|---|---|---|---|---|
| JP | 2009098153 | A | * | 5/2009 | ............. G01R 1/073 |
| TW | I718938 | B | | 2/2021 | |
| TW | I719895 | B | | 2/2021 | |
| TW | I721903 | B | | 3/2021 | |
| TW | M612806 | U | | 6/2021 | |

* cited by examiner

MEMBRANE PROBE CARD, METHOD OF MAKING THE SAME AND METHOD OF MAKING TESTED SEMICONDUCTOR CHIP BY USING THE SAME

CROSS REFERENCE TO RELATED APPLICATIONS

This non-provisional application claims the benefit under 35 U.S.C. § 119 (e) to U.S. Provisional Application No. 63/462,942, filed on Apr. 28, 2023, and under 35 U.S.C. § 119 (a) to patent application No. 113105817, filed in Taiwan on Feb. 19, 2024, all of which are hereby expressly incorporated by reference into the present application.

BACKGROUND OF THE INVENTION

1. Field of the Invention

The present invention relates generally to probe cards and more particularly, to a membrane probe card, a method of making the membrane probe card, and a method of making a tested semiconductor chip by using the membrane probe card.

2. Description of the Related Art

It is known that a conventional membrane probe card is composed of a membrane circuit board and a plurality of probes protruding from a surface of the membrane circuit board. Compared to the probe card composed of a printed circuit board and a probe head, the probe lengths of the membrane probe card, i.e., the heights of the probes protruding over the surface of the membrane circuit board (hereinafter referred to as "probe heights"), are relatively short, and the signal transmission paths of the membrane probe card are relatively short too. Therefore, membrane probe cards are particularly suitable for high-frequency testing.

The known method for manufacturing probes of membrane probe cards involves first forming multiple recesses on an insulating substrate by wet etching. The shapes of the recesses correspond to the shapes of the desired probes. Then, the probes are formed in the recesses by electroplating. After the probes are bonded to the membrane circuit board, the insulating substrate is removed. However, due to process limitations, there is a certain center-to-center distance (pitch) between these probes, which makes the probes difficult to meet the testing requirements of fine pitch.

Another known method for manufacturing probes of membrane probe cards is similar to the aforementioned one, but replaces the insulating substrate with a silicon substrate. When wet etching is performed on the silicon substrate, square-based pyramidal recesses corresponding to the silicon crystal lattice directions are formed. Therefore, the probes produced by this method are square-based pyramids with specific inclined angles on their sides. The higher the probe height is required, the wider the width at the widest portion (i.e., the portion connected to the membrane circuit board) will be. Therefore, if this type of membrane probe card is to meet the testing requirements of fine pitch, the probes will be very thin, which may lead to insufficient structural strength and easy breakage. Additionally, the probes may be too short to meet the required probe height for testing.

Furthermore, to manufacture probes having specific width variations in a stepwise manner by the above-mentioned method, it is required to make different width segments by using photolithography step by step. As such, these processing steps are complicated and time-consuming, and the probe made by segmented laminations may have a weak structural strength, which is liable to break at the conjunction interfaces. Moreover, in the aforementioned method, because the probes are formed by electroplating in the recesses, during the electroplating process there may be problems with low exchange rate of the electroplating solution, leading to pinholes formed by bubbles of the electroplating solution on the surface and in the inside of the probes. This also leads to poor structural strength of the probes and may render them unusable due to the pinholes on the contact end faces of the probes.

SUMMARY OF THE INVENTION

The present invention has been accomplished in view of the above-noted circumstances. It is an objective of the present invention to provide a membrane probe card, which may have a fine probe pitch, a good structural strength, and a required probe height for testing.

To attain the above-mentioned objective, the present invention provides a membrane probe card comprising a membrane device including a membrane wiring structure and a plurality of probes. The membrane wiring structure comprises at least one trace and a probe protruding surface. The probes are disposed on the membrane wiring structure and protrude from the probe protruding surface. Each probe defines a height axis, a length axis, and a width axis, which are perpendicular to each other. Each probe comprises a base and a probe tip. The base is electrically and mechanically connected with the trace of the membrane wiring structure and protrudes from the probe protruding surface along the height axis by a first height. The base comprises a first side edge, a second side edge opposite to the first side edge, a tip placement section extending from the first side edge towards the second side edge along the length axis, and an extension section extending from the tip placement section along the length axis to the second side edge. The tip placement section defines a width in the width axis. The probe tip is made by laser processing and electroplating. The probe tip protrudes from the base along the height axis by a second height and is electrically connected with the trace of the membrane wiring structure by the base. The probe tip is located at the tip placement section of the base and includes a fixed end portion that is connected with the base and defines a width along the width axis in a way that the width of the tip placement section is greater than the width of the fixed end portion of the probe tip. Each probe defines along the length axis a first distance from a center of the probe tip to the first side edge of the base and a second distance from the center of the probe tip to the second side edge of the base in a way that the first distance is less than the second distance.

With the above-described technical features, i.e., the probe of the membrane probe card of the present invention comprises the base protruding from the membrane wiring structure and the probe tip protruding from the base, the probe height is the sum of the first height of the base and the second height of the probe tip. This allows achieving the required probe height for testing while maintaining fine pitch of the probes, without having the problem of poor structural strength due to excessively elongated probe tips. Moreover, during testing, when the probe tip makes contact with the device under test, it experiences reaction force which is then transmitted to the base. Since the base width is greater than the probe tip width, it effectively disperses the reaction force, thereby reducing the risk of probe breakage due to applied force during testing.

However, high structural strength of the probes may lead to poor elasticity, possibly causing a problem that the probes may be difficult in scraping through the oxide layers on the surfaces of the conductive contact pads of the device under test, resulting in unstable testing results. In the membrane probe card of the present invention, the probe tip is positioned closer to the first side edge of the base and farther from the second side edge, meaning the position of the probe tip on the base is biased towards one side. This technical feature enhances the elasticity of the probes, thereby preventing the problem of the probe tip struggling to scrape through the oxide layer on the device under test, consequently improving testing stability.

Preferably, the extension section of the base of each of the probes may comprise a tapered section having a width gradually reduced from the tip placement section towards the second side edge.

Due to the high structural strength of the probes, it is possible for the reactive force during testing to be too large to damage the trace connected to the base of the probe. Therefore, the extension section of the probe base is configured as having a tapered section, which reduces the reactive force transmitted from the probe tip, thereby preventing damage to the trace of the membrane wiring structure during testing.

More preferably, the extension section of the base of each probe may have two rounded corners at the second side edge.

In the probe of the present invention, since the second side edge of the base is farther from the probe tip, the reactive force during testing will be concentrated on the portion of the trace of the membrane wiring structure located at the second side edge, which may possibly lead to the breakage of this portion of the trace. In the membrane probe card of the present invention, the tapered section mentioned above has reduced the reactive force transmitted to the extension section, and the rounded corners at the second side edge further evenly distribute the reactive force transmitted to the second side edge, thereby avoiding breakage of the trace located at the second side edge.

Preferably, a connection portion between the base and the probe tip of each probe is concavely arc-shaped or shaped as a so-called filleted shape.

If a sharp angle exists at the connection portion between the base and the probe tip of the probe, stress concentration issues may arise during testing, potentially leading to probe breakage. Therefore, the connection portion between the base and the probe tip of the probe is made concave and rounded, avoiding stress concentration at the connection portion. Given the design of the structural strength of the probe, the cross-sectional area of the probe tip is smaller than that of the probe base. If the probe base and the probe tip are manufactured by using photolithography processes, where the probe base is patterned before the probe tip, it is difficult to control the connection portion between the base and the probe tip, resulting in a sharp angle. This can make products manufactured by using photolithography prone to damage. By employing the aforementioned concave and rounded structure and the subsequent manufacturing processes that will be illustrated hereunder, the connection portion between the base and the probe tip of the probe is made concave and rounded, further improving the stress concentration issue.

Preferably, the membrane wiring structure may comprise a surface dielectric layer including the probe protruding surface, and the base of each probe may include an inner embedded portion embedded in the surface dielectric layer, and an outer exposed portion protruding outside the surface dielectric layer. The cross-sectional areas of the inner embedded portion in the length axis and the width axis are greater than the cross-sectional areas of the outer exposed portion in the length axis and the width axis, respectively, and the inner embedded portions of adjacent two of the probes are separated by the surface dielectric layer.

As a result, the base of the probe is partially embedded in the membrane wiring structure. This feature allows for a more stable connection between the probe and the membrane wiring structure. Additionally, the inner embedded portions of the adjacent probes are separated by the surface dielectric layer of the membrane wiring structure, maintaining the pitch between the adjacent probes, and preventing offset or misalignment of the positions of the probe tips due to manufacturing issues. Furthermore, the feature that the base is partially embedded in the membrane wiring structure may enhance the structural strengths of the base and the membrane wiring structure, preventing the trace from breakage due to excessive stress on the connection portion between the base and the membrane wiring structure.

Preferably, the probe tip of each probe may have a contact end face farthest from the base, and the contact end face is flat.

In the present invention, the probes are manufactured by electroplating in the through holes of a metal substrate. Electroplating in the through holes allows for a high exchange rate of the plating solution, avoiding the formation of pinholes due to bubbles of the plating solution on the interior and surface of the probes. This ensures that the probes have a solid and homogeneous characteristic, leading to excellent structural strength and a flat surface without pinholes. Particularly, the contact end face of the probe tip is flat, which is advantageous for the stability of testing.

Preferably, the trace connected with the base of each probe extends from the second side edge of the base. The first side edge of the base and the trace respectively define a width in the width axis in a way that the width of the first side edge is greater than the width of the trace. Further, the second side edge of the base of each probe defines a width in the width axis in a way that the width of the second side edge is smaller than the width of the first side edge and greater than the width of the trace. Moreover, the width of the fixed end portion of the probe tip is greater than the width of the trace.

Since the probe tip of the probe is positioned closer to the first side edge of the base, the width of the first side edge is made larger than the width of the trace. This feature effectively disperses stress transmitted to the membrane wiring structure, thereby preventing stress concentration on the trace, and avoiding breakage of the trace during testing. As mentioned above, the high structural strength of the probe may result in excessive reactive force during testing, potentially damaging the traces connected to the base of the probe. Therefore, the width of the second side edge of the base of the probe is made smaller than that of the first side edge, reducing the reactive force. Additionally, the width of the second side edge is greater than that of the trace, further dispersing stress transmitted to the membrane wiring structure and preventing stress concentration on the trace, thus avoiding breakage of the trace during testing. The width of the fixed end portion of the probe tip is greater than that of the trace, allowing for the gradual dispersion of reactive forces before reaching the base of the probe. Combined with the stress-dispersing action of the base mentioned above, this effectively disperses stress transmitted to the membrane wiring structure, further preventing stress concentration on the trace, and thus more effectively avoiding trace breakage.

Preferably, each probe may comprise an outer layer exposed outside and at least one inner layer shielded by the outer layer. The outer layer and the at least one inner layer are made of different metals, and extend from the probe tip to the base.

As such, the outer layer of the probe may be made of a metal having a great hardness, such as rhodium (Rh), to enhance the wear resistance of the probe. The inner layer of the probe may be made of different metals depending on the requirements, and the probe may be configured as having a single inner layer or multiple inner layers. For example, the innermost layer may be made of a metal having a high conductivity, such as copper (Cu), while the inner layers between the innermost layer and the outer layer may be made of a metal with good oxidation resistance, such as nickel (Ni). Both the outer and inner layers extend from the probe tip to the base, indicating that each of the outer layer and the inner layer is simultaneously formed with the parts at the base and the probe tip during manufacturing. This feature ensures that there are no segmented interfaces between the probe tip and the base, making the connection portion between the probe tip and the base less prone to breakage under stress.

Preferably, each probe may have a space located inside the inner layer.

More specifically, the innermost layer of the probe may be hollow and unfilled, creating a space therein. This helps reduce the stress transmitted to the membrane wiring structure by the probe tip, thus avoiding breakage of the trace due to excessive force. Additionally, with the aforementioned space inside the probe, the trace of the membrane wiring structure may partially extend into the space within the base, and even further into the space within the probe tip. The portions of the trace inside the probe and outside the probe may be integrally formed without segmented stacked interfaces, thereby not only enhancing the structural strength of the trace itself but also protecting the trace from stress by the probe base so as to minimize the affection of the stress to the trace.

Preferably, the base of each probe may comprise a plurality of base layers, and the cross-sectional areas of the base layers in the length axis and the width axis are different. Further, a connection portion between two of the base layers is concavely arc-shaped.

Compared to the pattern having only a single base layer, the multiple base layers may gradually reduce the cross-sectional areas thereof from the membrane wiring structure towards the probe tip layer by layer, further increasing the probe height while maintaining the structural strength of the probe tip. If the connection portions of the base layers form sharp corners, stress concentration issues may occur during testing, leading to probe breakage. Therefore, forming the connection portions of the base layers into concave round arcs can prevent stress concentration at the connection portions.

Preferably, the probe tips of the probes are formed separately in a plurality of through holes of a metal substrate, and the through holes of the metal substrate are formed by laser processing.

In other words, a laser processing is first used to form through holes (through holes) in the metal substrate in a shape corresponding to the desired shape of the probe tip, and then the probe tips are further formed in the through holes of the metal substrate. Consequently, the through holes formed by the laser processing are not limited by shape or inclination angles and can achieve a high aspect ratio, thus meeting the requirements for probe height, width, pitch, and shape necessary for testing, while allowing the probe of the membrane probe card to achieve the required probe height and good structural strength while maintaining the fine pitch requirement. Additionally, the good structural strength of the metal substrate prevents the metal substrate from being affected by environmental factors such as temperature and humidity during manufacturing. Furthermore, the probe tips may be formed by electroplating in the through holes of the metal substrate. This allows for a high exchange rate of the electroplating solution flowing in and out of the through holes, avoiding the formation of pinholes due to bubbles in the electroplating solution on the surface and in the interior of the probe, thus making the probes solid and homogeneous, thereby providing good structural strength. It also ensures that the probe surface is smooth without pinholes, especially the contact end face of the probe tip is flat, which is beneficial for the stability of testing. More preferably, a pitch between adjacent two probe tips is less than 50 μm, and the heights of the probe tips are greater than 50 μm. In the present invention, using the laser processing on the metal substrate to form through holes may ensure that the pitches of the probes of the membrane probe card conform to the specified standards, and at the same time, the heights of the probe tips may also reach the specified standards. In the present invention, the metal substrate is used to be immersed in the electroplating solution for forming the probe tips. Because the metal substrate does not have water absorption characteristics, the dimensional changes of the metal substrate due to water absorption may not occur, thereby avoiding affection of the stability of the substrate size.

Preferably, the membrane probe card may further comprise a circuit board and a probe seat mounted to the circuit board. An elastic structure is provided inside the probe seat, and the membrane wiring structure is mounted to the probe seat and electrically connected with the circuit board.

As a result, the circuit board may be electrically connected with a testing machine, thereby facilitating the electrical connection between the membrane wiring structure and the probes of the membrane device and the testing machine. Additionally, the elastic structure may provide a buffering effect when the probes contact the device under test (DUT).

Anther objective of the present invention is to provide a method of making a membrane probe card having a fine probe pitch, a good structural strength, and a required probe height for testing. To attain the above-mentioned objective, the method for making the membrane probe card comprises the steps of:

a) providing a metal substrate having an upper surface and a lower surface;

b) forming a plurality of through holes penetrating through the upper surface and the lower surface of the metal substrate by laser processing;

c) forming a conductive body in each of the through holes of the metal substrate by electroplating, each of the conductive bodies having a top surface and a bottom surface;

d) arranging a membrane wiring structure in a way that the top surface of each of the conductive bodies is connected with the membrane wiring structure; and e) removing the metal substrate such that each of the conductive bodies protrudes from the membrane wiring structure to serve as a probe.

By the above-mentioned features, the through holes made by the laser processing are free from shape or tilt angle restrictions, and can achieve high aspect ratios. Therefore, it can meet the requirements of probe height, width, pitch, and shape (e.g., truncated cone or square-based pyramid) needed for testing. This allows the probes of the membrane probe card to achieve the required probe height and good structural strength while achieving fine pitch requirement. Moreover, in step a), a metal substrate is used, which has good structural strength and can avoid being affected by environmental factors such as temperature and humidity during the manufacturing process. In step b), the through holes penetrate through the upper and lower surfaces of the metal substrate, and in step c), the conductive bodies are formed by electroplating within the through holes of the metal substrate. As a result, the electroplating solution can enter and exit the through holes with a high exchange rate, thereby avoiding the formation of pinholes caused by bubbles of the electroplating solution in the interior and on the external surface of the completed probe. This enables the probes to have solid and homogeneous characteristics, thereby ensuring good structural strength and a smooth surface without pinholes. Especially, the contact end face of the probe tip is flat, which is conducive to the stability of testing. Additionally, since the metal substrate and the conductive bodies may be made of different materials, in step e), when removing the metal substrate, it prevents the conductive bodies from being partially or entirely removed, thus avoiding deformation of the probe shape or structural damage that renders the probe unusable.

Preferably, after the step b) and before the step c), the through holes are subjected to micro-etching processing.

The micro-etching processing may make the hole walls of the through holes smoother, and after the micro-etching processing is performed, a step of electroplating metal (such as copper) on the hole walls may be further performed to make the hole walls more smoother. The smooth hole walls of the through holes may make the surfaces of the manufactured probes smooth, which are beneficial for the stability of the test. In addition, if the through hole has a stepwise structure, sharp corners may also be rounded by the micro-etching processing, making the probe part formed at the rounded corner concave and arc-shaped, or so-called filleted shape, thereby avoiding stress concentration at the part of the probe and preventing probe breakage.

Preferably, after step a), at least one metal layer is formed on the upper surface of the metal substrate by photolithography and electroplating in a way that the at least one metal layer is provided with a plurality of penetrating grooves, through which the upper surface of the metal substrate is exposed outside. The step b) is performed by using the laser processing to form the through holes in the metal substrate through the penetrating grooves, where each of the penetrating grooves is in communication with one of the through holes in a one-to-one manner, and a cross-sectional area of each of the penetrating grooves is greater than a cross-sectional area of associated one of the through holes. In the step c), each of the conductive bodies is formed in one of the through holes and associated one of the penetrating grooves, such that each of the conductive bodies includes a probe tip portion located inside the through hole and a base portion located inside the penetrating groove. In the step e), the metal substrate and the at least one metal layer are removed.

Accordingly, each probe formed by the respective conductive body will have a probe tip and a base formed respectively by the probe tip portion and the base portion, similar to the probes of the membrane probe card provided by the present invention as described above. Such probes including bases and probe tips can simultaneously achieve fine pitch, high structural strength, and the required probe height for testing. Further, the base width is greater than the probe tip width, effectively dispersing the reactive force from the device under test, thereby reducing the breakage risk of the probe and the trace of the membrane wiring structure. Furthermore, the base and probe tip of the probe are simultaneously formed in step c), so there is no segmented stacking interface between the base and the probe tip of the probe, making the connection portion between the probe tip and the base less susceptible to breakage due to force. In addition, the subsequent micro-etching processing after step b) can also round the connection portion between the through hole and the penetrating groove, making the connection portion between the probe tip and the base of the completed probe concave and arc-shaped, thereby avoiding stress concentration at the connection portion and preventing probe breakage. Moreover, the at least one metal layer may be a plurality of metal layers, and by stacking multiple metal layers, a stepped penetrating groove may be formed, so that the formed probe base contains a plurality of base layers with different cross-sectional areas. In this configuration, the subsequent micro-etching processing after step b) can also round the sharp corners of the stepped penetrating groove, making the connection portion between adjacent base layers of the completed probe concave and arc-shaped, thereby avoiding stress concentration at the connection portion and preventing probe breakage. Furthermore, the feature that a part of the base is embedded in the membrane wiring structure can further strengthen the base and the membrane wiring structure, avoiding the trace from breakage due to excessive stress on the connection portion between the base and the membrane wiring structure.

Preferably, the step b) further includes a substep of forming a patterned dielectric layer on the at least one metal layer in a way that the patterned dielectric layer has a plurality of openings in communication with the penetrating grooves in a one-to-one manner, and a cross-sectional area of each of the openings is greater than the cross-sectional area of associated one of the penetrating grooves. In the step c), each of the conductive bodies is formed in one of the through holes and associated one of the penetrating grooves and one of the openings.

In this way, the patterned dielectric layer can serve as the surface dielectric layer of the membrane wiring structure, and the base of the probe will have a portion (i.e., the portion formed by the conductive body within the opening of the patterned dielectric layer) embedded in the surface dielectric layer of the membrane wiring structure. This can make the connection between the probe and the membrane wiring structure more secure, and the inner embedded portions of the bases of adjacent probes are separated by the surface dielectric layer of the membrane wiring structure, thereby maintaining the pitch between the adjacent probes, and avoiding offset or misalignment of the positions of the probe tips due to manufacturing issues. Additionally, the inner embedded portion of the base of the probe is formed simultaneously with other parts of the base and the probe tip in step c), so there are no segmented stacking interfaces in the base of the probe, making the probe less susceptible to breakage due to forces. Furthermore, the subsequent micro-etching processing after step b) can also round the connection portion between the penetrating groove and the opening, creating a concave rounded shape, or so-called filleted shape, at the probe portion formed at the rounded corner, thereby avoiding stress concentration at the corner, and preventing probe breakage.

More preferably, the metal substrate and the at least one metal layer are made of a same material.

Since the step e) involves removing the metal substrate and the at least one metal layer, and the metal substrate and the at least one metal layer are made of the same material, it is easier to remove the metal substrate and the at least one metal layer simultaneously.

Preferably, the metal substrate is made of beryllium-copper alloy, silver-copper alloy, or nickel-iron alloy.

Beryllium-copper alloy, silver-copper alloy, and nickel-iron alloy have excellent structural strength and are easy to process with laser and electroplating, making them preferable materials for the metal substrate. However, the material of the metal substrate is not limited to these.

Preferably, in the step b), a plurality of recesses are formed on the upper surface of the metal substrate, and then the through holes are formed by the laser processing in a way that each of the recesses is in communication with one of the through holes in a one-to-one manner and a cross-sectional area of each of the recesses is greater than a cross-sectional area of associated one of the through holes. In the step c), each of the conductive bodies is formed in one of the through holes and associated one of the recesses in a way that each of the conductive bodies includes a probe tip portion located inside the through hole and a base portion located inside the recess.

Accordingly, each probe formed by the respective conductive body will have a probe tip and a base formed respectively by the probe tip portion and the base portion, similar to the probes of the membrane probe card provided by the present invention as described above. Such probes containing bases and probe tips can simultaneously achieve fine pitch, high structural strength, and the required probe height for testing. Further, the base width is greater than the probe tip width, effectively dispersing the reactive force from the device under test, thereby reducing the breakage risk of the probe and the trace of the membrane wiring structure. Moreover, the base and probe tip of the probe are simultaneously formed in step c), so there is no segmented stacking interface between the base and the probe tip of the probe, making the connection portion between the probe tip and the base less prone to breakage due to force. Additionally, the subsequent micro-etching processing after step (b) can also round the connection portion between the through hole and the recess, making the connection portion between the probe tip and the base of the completed probes concave and arc-shaped, or so-called filleted shape, thereby avoiding stress concentration at the connection portion between the probe tip and base and preventing probe breakage.

More preferably, the recesses are formed by micro-etching processing or laser processing.

In this way, the micro-etching processing can form appropriately sized recesses, allowing the manufactured probes to still meet the requirements of fine pitch. The laser processing can easily control the shape and size of the recesses, and after the recesses are completed, the laser processing can continue to form the through holes, resulting in good processing efficiency. In addition, the recesses formed by the laser processing may be made having a stepped profile, allowing the formed probe bases to include multiple base layers with different cross-sectional areas. In this case, the micro-etching processing after step b) can also round off the sharp corners of the stepped recesses, making the connection portions of adjacent base layers of the manufactured probes concave and rounded, or so-call filleted shape. This helps to avoid stress concentration at the connection portions of the base layers, thereby preventing probe breakage.

Preferably, the step b) further includes a substep of forming a patterned dielectric layer on the upper surface of the metal substrate in a way that the patterned dielectric layer has a plurality of openings in communication with the recesses in a one-to-one manner, and a cross-sectional area of each of the openings is greater than a cross-sectional area of associated one of the recesses; and in the step c), each of the conductive bodies is formed in one of the through holes and associated one of the recesses and one of the openings.

In this way, the patterned dielectric layer can serve as the surface dielectric layer of the membrane wiring structure, and the base of the probe will have a portion (i.e., the portion formed by the conductive body within the opening of the patterned dielectric layer) embedded in the surface dielectric layer of the membrane wiring structure. This can make the connection between the probe and the membrane wiring structure more secure, and the inner embedded portions of the bases of adjacent probes are separated by the surface dielectric layer of the membrane wiring structure, thereby maintaining the pitch between the adjacent probes, and avoiding offset or misalignment of the positions of the probe tips due to manufacturing issues. Additionally, the inner embedded portion of the base of the probe is formed simultaneously with other parts of the base and the probe tip in step c), so there are no segmented stacking interfaces in the base of the probe, making the probe less susceptible to breakage due to forces. Furthermore, the subsequent micro-etching processing after step b) can also round the connection portion between the recess and the opening, creating a concave rounded shape, or so-called filleted shape, at the probe portion formed at the rounded corner, thereby avoiding stress concentration at the corner, and preventing probe breakage.

Preferably, the step b) may further include a substep of forming a patterned dielectric layer on the upper surface of the metal substrate in a way that the patterned dielectric layer has a plurality of openings in communication with the through holes in a one-to-one manner, and a cross-sectional area of each of the openings is greater than a cross-sectional area of associated one of the through holes. In the step c), each of the conductive bodies is formed in one of the through holes and associated one of the openings.

Even without the aforementioned metal layer and penetrating grooves thereof, or without first forming recesses on the upper surface of the metal substrate, a patterned dielectric layer may still be formed on the upper surface of the metal substrate to serve as the surface dielectric layer of the membrane wiring structure, and make the base of the probe have a portion (i.e., the portion formed by the conductive body within the opening of the patterned dielectric layer) embedded in the surface dielectric layer of the membrane wiring structure. This can make the connection between the probe and the membrane wiring structure more secure, and the inner embedded portions of the bases of adjacent probes are separated by the surface dielectric layer of the membrane wiring structure, thereby maintaining the pitch between the adjacent probes, and avoiding offset or misalignment of the positions of the probe tips due to manufacturing issues. Additionally, the base of the probe is formed simultaneously with the probe tip in step c), so there are no segmented stacking interfaces between the base and the probe tip, making the connection portion between the probe tip and the base less susceptible to breakage due to forces. Furthermore, the subsequent micro-etching processing after step b) can also round the connection portion between the through hole and the opening, creating a concave rounded shape, or so-called filleted shape, at the connection portion between the base and the probe tip of the completed probe, thereby avoiding stress concentration at the aforesaid connection portion and preventing probe breakage.

Preferably, in the step b), an upper dielectric layer and a lower dielectric layer may be provided on the upper surface and the lower surface of the metal substrate, respectively, and then the through holes are formed in the metal substrate by the laser processing in a way that the through holes penetrate through the upper dielectric layer and the lower dielectric layer. In the step c), the portion of each of the through holes located in the upper dielectric layer is enlarged to form a slot, and the conductive body is also formed in the slot.

Accordingly, each probe formed by the respective conductive body will have a probe tip formed in the through hole and a base formed in the slot, similar to the probes of the membrane probe card provided by the present invention as described above. Such probes containing bases and probe tips can simultaneously achieve fine pitch, high structural strength, and the required probe height for testing. Further, the base width is greater than the probe tip width, effectively dispersing the reactive force from the device under test, thereby reducing the breakage risk of the probe and the trace of the membrane wiring structure. Moreover, in the step b) the upper and lower dielectric layers are respectively provided on the upper and lower surfaces of the metal substrate, which can prevent the metal substrate from bending or warpage during manufacturing process. Furthermore, the subsequent micro-etching processing after step b) can also round the connection portion between the through hole and the slot, creating a concave rounded shape, or so-called filleted shape, at the connection portion between the base and the probe tip of the completed probe, thereby avoiding stress concentration at the aforesaid connection portion and preventing probe breakage. After the probe is formed, the upper dielectric layer may serve as the surface dielectric layer of the membrane wiring structure, and the base of the probe has a portion embedded in the surface dielectric layer of the membrane wiring structure. This can make the connection between the probe and the membrane wiring structure more secure, and the bases of adjacent probes are separated by the surface dielectric layer of the membrane wiring structure, thereby maintaining the pitch between the adjacent probes, and avoiding offset or misalignment of the positions of the probe tips due to manufacturing issues. Additionally, the feature that the base is embedded in the membrane wiring structure may enhance the structural strengths of the base and the membrane wiring structure, thereby preventing the trace from breakage due to excessive stress on the connection portion between the base the and the membrane wiring structure.

Further scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1D:
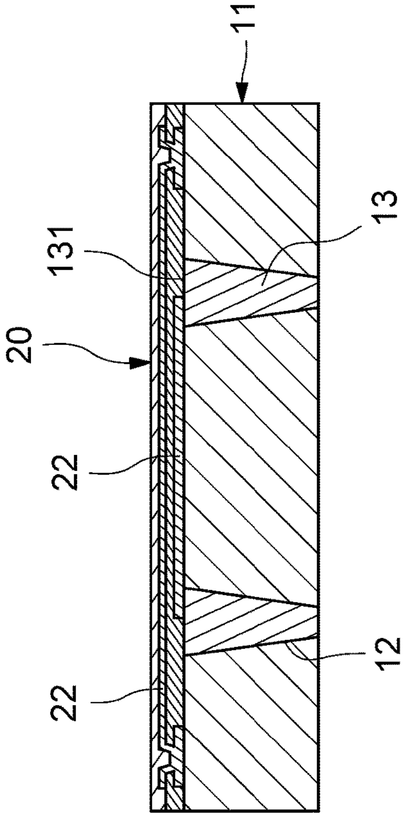
FIGS. 1*a* to 1*e* are schematic views showing the steps of a method of making a membrane probe card according to a first preferred embodiment of the present invention.

First, it is to be mentioned that same or similar reference numerals used in the following embodiments and the appendix drawings designate same or similar elements or the structural features thereof throughout the specification for the purpose of concise illustration of the present invention. It should be noticed that for the convenience of illustration, the components and the structure shown in the figures are not drawn according to the real scale and amount, and the features mentioned in each embodiment can be applied in the other embodiments if the application is possible in practice. Besides, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between aforesaid former and latter elements.

Figure 1E:
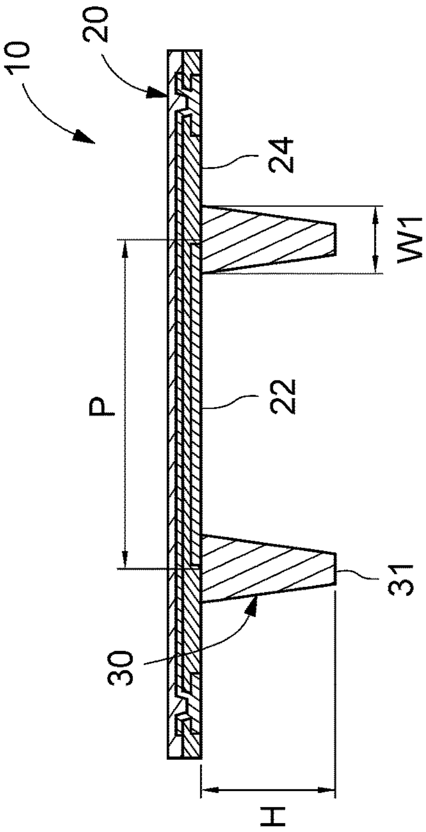
Figure 1A:
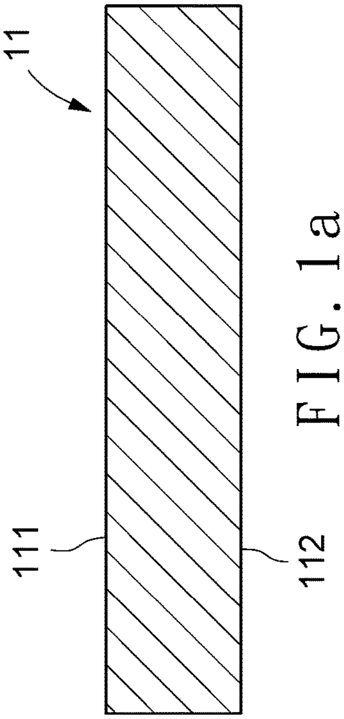

Referring to FIGS. 1*a* to 1*e*, a method of making a membrane probe card provided by a first preferred embodiment of the present invention includes the following steps a) to e).

a) As shown in FIG. 1*a*, a metal substrate 11 is provided having an upper surface 111 and a lower surface 112.

Figure 1B:
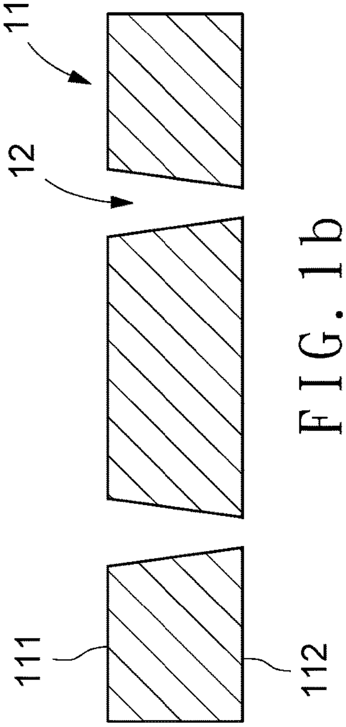

This step a) selects a metal substrate to serve as a support member for production. The metal substrate has a good structural strength, which can avoid being affected by the environment in subsequent processes, such as temperature, humidity, etc. Preferably, the material of the metal substrate 11 is beryllium-copper alloy, silver-copper alloy, or nickel-iron alloy, which have good structural strength and are easy to be processed by the following laser processing and electroplating steps. However, the metal substrate 11 may be other conductive metals, such as aluminum, stainless steel, etc.

b) As shown in FIG. 1*b*, a plurality of through holes 12 are formed in the metal substrate 11 by using laser processing in a way that each through hole 12 penetrates through the upper surface 111 and the lower surface 112 of the metal substrate 11.

It should be mentioned here that each through hole 12 is used to manufacture a probe 30 (as shown in FIG. 1*e*). To simplify the drawings and for concise illustration, the drawings for illustrating the manufacturing method of the present invention only show the steps of simultaneously manufacturing two probes 30. In fact, the manufacturing method of the present invention will simultaneously manufacture a lot of probes 30. That is, the membrane probe card of the present invention includes many probes 30.

Figure 1C:
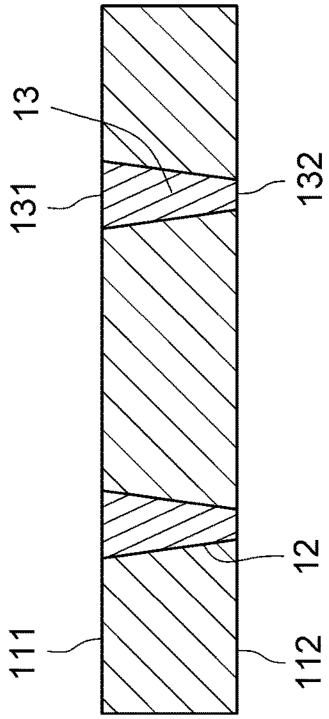

In this embodiment, the through hole 12 gradually tapers from the upper surface 111 to the lower surface 112 for producing a probe tip having a conical shape. However, the shape of the through holes 12 in the present invention is not limited. For example, the through holes 12 can be of equal width from the upper surface 111 to the lower surface 112.

c) As shown in FIG. 1*c*, conductive bodies 13 are respectively formed in the through holes 12 of the metal substrate 11 by electroplating, and each conductive body 13 has a top surface 131 and a bottom surface 132.

In this embodiment, in step c), the conductive bodies 13 are formed by electroplating using only a single material (such as palladium-cobalt alloy). However, in the manufacturing method of the present invention, step c) can also be performed by electroplating with multiple materials separately to form the conductive bodies 13 in layers, which will be detailedly illustrated hereinafter.

Preferably, after the aforementioned step b), the through holes 12 can be processed by micro-etching processing before proceeding to step c). Specifically, after laser processing, the walls of the through holes 12 can be cleaned and micro etched to make them smoother. Even further, after the micro-etching processing, metal (such as copper) can be electroplated onto the rough surfaces of the through hole walls to fill in the rough areas, making the walls smoother. The smooth walls of the through holes 12 result in smoother surfaces of the manufactured probes 30, which is advantageous for acquiring testing stability. Additionally, if the through hole 12 has a stepped profile, sharp corners can be rounded by the micro-etching processing, such that the parts of the probe formed at the rounded corners will have a concave and arc shape. This prevents stress concentration on the parts, thereby preventing the probe from breakage.

d) As shown in FIG. 1*d*, a membrane wiring structure 20 is arranged in a way that the top surfaces 131 of each conductive body 13 are connected with the membrane wiring structure 20.

The structure of the membrane wiring structure 20 and the manufacturing method thereof in the present invention are similar to those of the conventional membrane circuit boards, and therefore, detailed descriptions will not be necessarily given here. In brief, the membrane wiring structure 20 is a structure containing laminated thin film layers produced by photolithography by using dielectric and metal materials. The metal materials form multiple traces 22 separated by the dielectric materials.

e) Remove the metal substrate 11 so that each conductive body 13 forms a probe 30 protruding from the membrane wiring structure 20, as shown in FIG. 1*e*.

Figure 10:
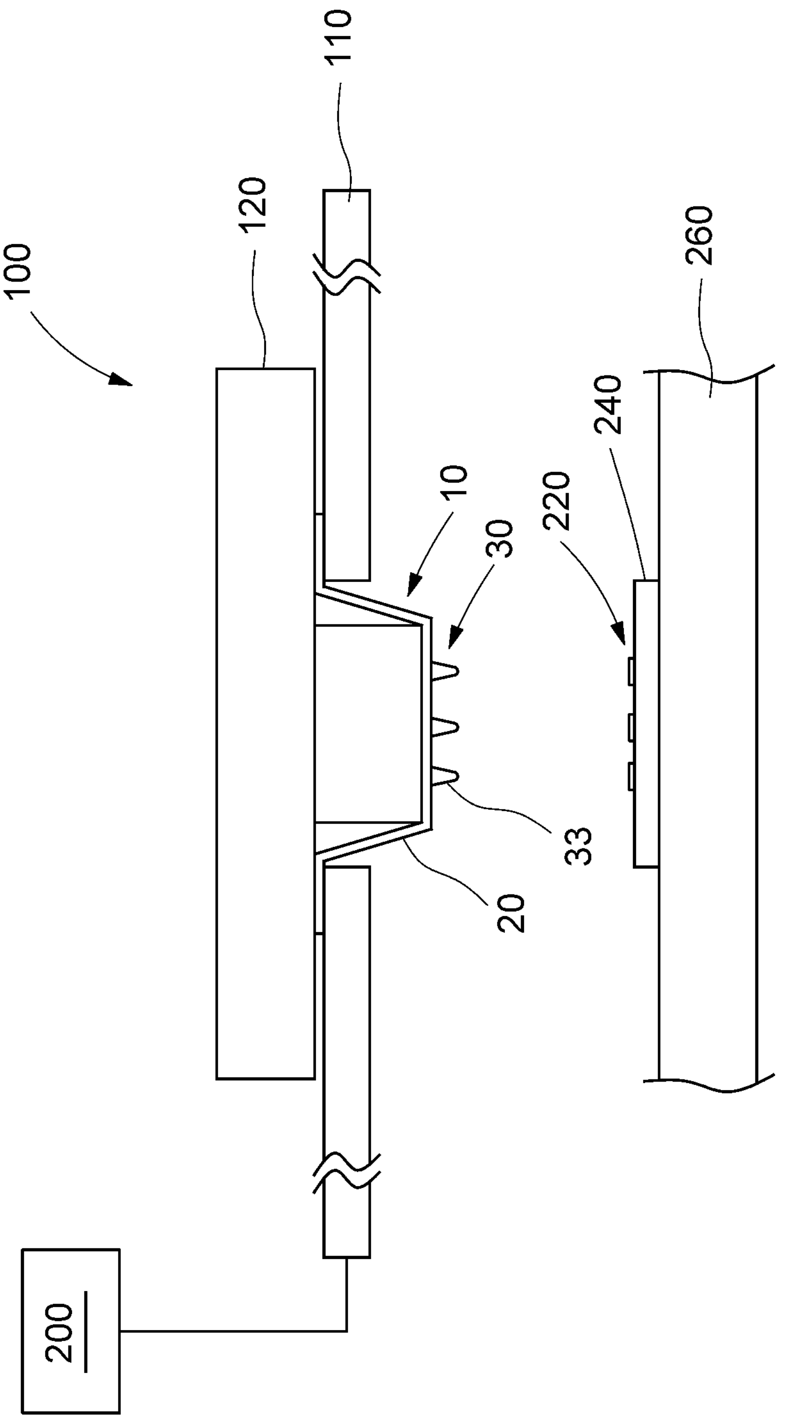
FIG. 10 is a schematic view showing a membrane probe card provided by the present invention.

The aforementioned manufacturing method is to produce the device as shown in FIG. 1*e*. More specifically, this device is a membrane device 10 of a membrane probe card 100 (as shown in FIG. 10). The membrane device 10 of the membrane probe card 100 includes a membrane wiring structure 20 and probes 30. The probes 30 are disposed on the membrane wiring structure 20 and protrude from a probe protruding surface 24 of the membrane wiring structure 20 for making contacts with a device under test (not shown) by using contact end faces 31 of the probes 30. Additionally, the probes 30 are connected with the traces 22 of the membrane wiring structure 20. Thus, the probes 30 and the traces 22 they are connected with are electrically connected with each other and can collectively transmit test signals for testing the device under test.

Figure 11:
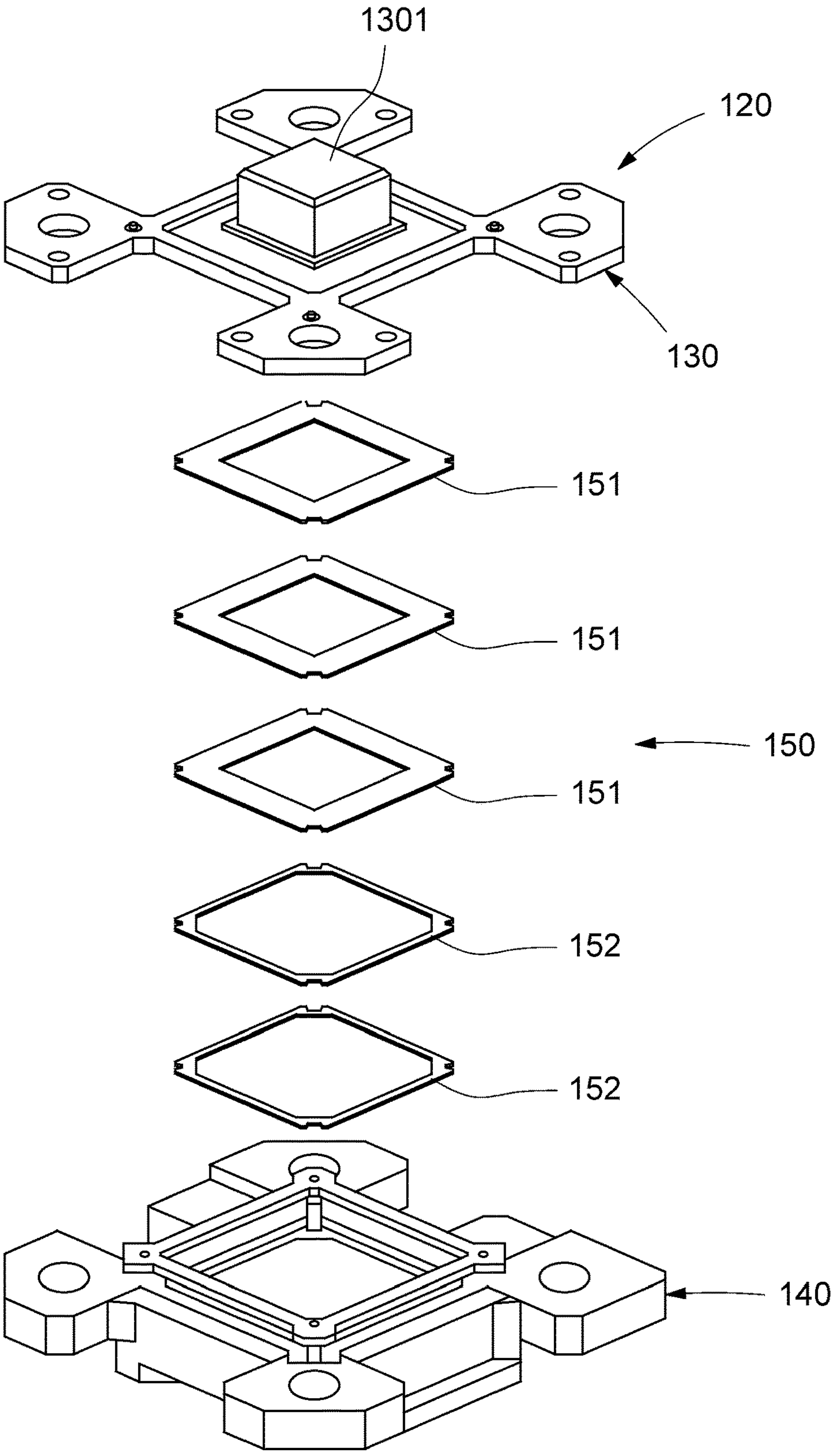
FIG. 11 is an exploded perspective view of a probe seat of the membrane probe card.

As shown in FIG. 10, the membrane probe card 100 further includes a circuit board 110 and a probe seat 120 used to support the membrane device 10. Specifically, the outer peripheral portion of the membrane wiring structure 20 of the membrane device 10 is sandwiched between the probe seat 120 and the circuit board 110, and a plurality of electrical contacts (not shown) are provided on a surface of the outer peripheral portion facing the circuit board 110, such that the membrane wiring structure 20 is electrically connected to the circuit board 110 via the electrical contacts. Furthermore, the central portion of the membrane wiring structure 20, which are arranged with the probes 30, is supported by a plunger of the probe seat 120 for providing support and buffering effect to the probes 30 when the probes 30 contact the device under test. Consequently, the circuit board 110 is electrically connected to a testing machine 200, such that the membrane wiring structure 20 and the probes 30 of the membrane device 10 are electrically connected with the testing machine 200. When the probes 30 are in contact with conductive pads 220 of a device under test (such as a semiconductor chip 240 supported on a chuck 260 as shown in FIG. 10), the test signal will be transmitted from the testing machine 200 to the semiconductor chip 240 via the probe tips 33 of the probes 30 of the membrane wiring structure 20 and the conductive pads 220, and the resulted signal generated by the semiconductor chip 240 will be transmitted back to the testing machine 200 for further analysis via the conductive pads 220 and the probe tips 33 of the probes 30 of the membrane wiring structure 20. FIG. 10 only schematically depicts the structure of the membrane probe card 100. As shown in FIG. 11, the probe seat 120 may actually be composed of an upper seat body 130, a lower seat body 140, and an elastic structure 150 positioned between the upper and lower seat bodies 130 and 140. The upper and lower seat bodies 130 and 140 are secured to the circuit board 110 by screws (not shown). The membrane wiring structure 20 is mounted to the upper seat body 130, and the upper seat body 130 may include a protrusion 1301 to raise, support, and hold the membrane wiring structure 20 in position. The elastic structure 150 may include at least one spring piece 151 and at least one silicone film 152 to provide buffering effect when the probes 30 contact the device under test.

In step b), there are no restrictions on the shape or inclination angle of the holes 12 formed by laser processing. The inner wall inclination angle of the required conical or square-based pyramidal holes 12 can be formed by controlling the angle of the laser. For example, when a larger probe height H is required and a deeper hole 12 needs to be drilled, the laser can be controlled to have a smaller inclination angle relative to the height axis to achieve a high depth-to-width ratio characteristic. Therefore, the probes 30 in the present invention can meet the required probe height H, probe width W1, pitch P, and shape (e.g., truncated cone or square-baes pyramid), allowing the probes 30 of the membrane probe card to achieve the required probe height H and good structural strength while achieving fine pitch requirement. Additionally, in step b), the through holes 12 penetrate through the upper and lower surfaces 111, 112 of the metal substrate 11, and in step c), conductive bodies 13 are formed by electroplating in the through holes 12 of the metal substrate 11. In this way, the electroplating solution can enter and exit the through holes 12 with a high exchange rate, avoiding pinholes formed by bubbles of electroplating solution in the interior or on the surface of the completed probes 30. Thus, the probes 30 have solid and homogeneous characteristics, resulting in good structural strength, and smooth surfaces of the probes 30 without pinholes. Especially, the contact end face 31 of the probe tip (the entire probe 30 is belonged to the probe tip in this embodiment) is flat, which is conducive to testing stability.

The manufacturing methods and membrane devices 10 provided by other embodiments of the present invention, which will be detailedly illustrated hereunder, have the technical features and effects same as those of the manufacturing method and membrane device 10 of the first preferred embodiment described above, and therefore they will not be redundantly described hereinafter.

Figure 2D:
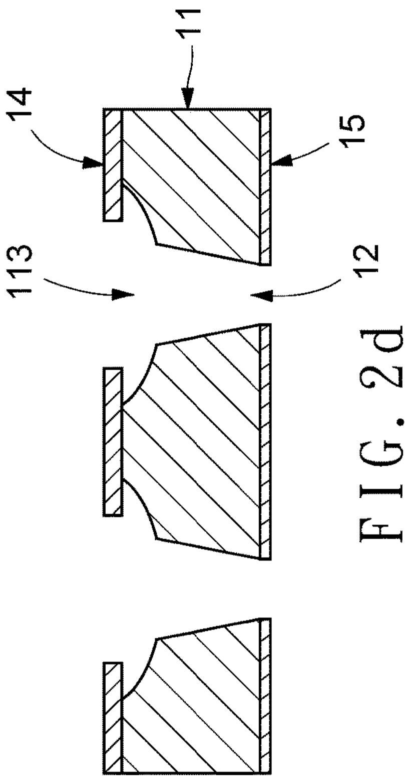
FIGS. 2*a* to 2*d* are schematic views showing some of the steps of a method of making a membrane probe card according to a second preferred embodiment of the present invention.
Figure 2E:
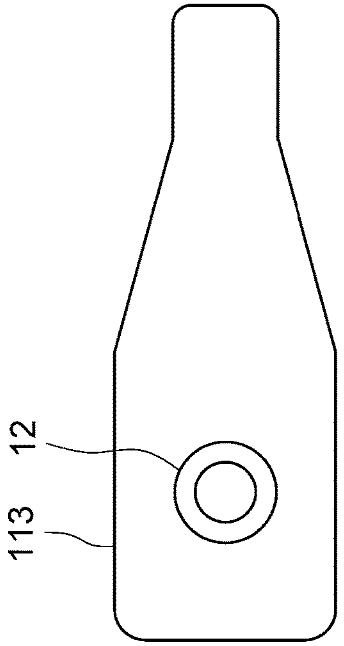
FIG. 2*e* is a schematic top view of a recess shown in FIG. 2*d;*
Figure 2A:
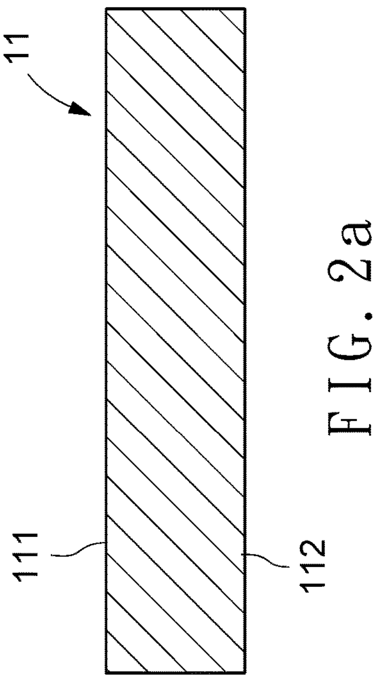
Figure 2B:
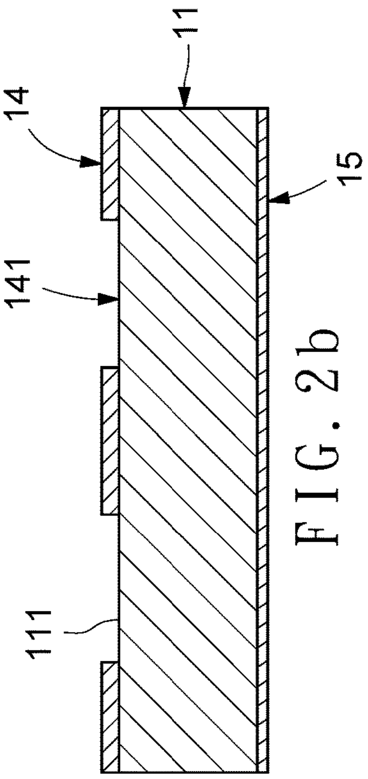
Figure 2C:
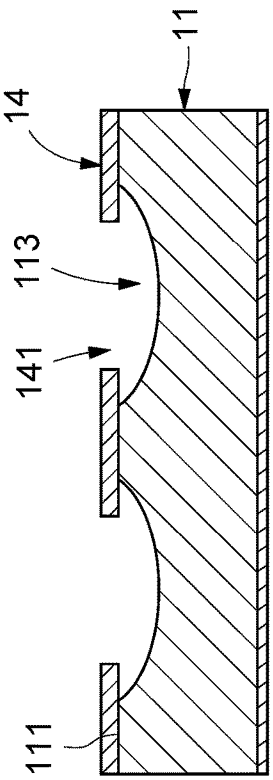
Figure 3D:
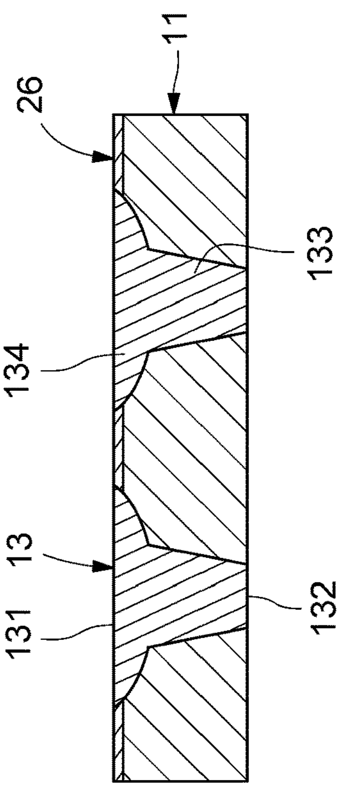
FIGS. 3*a* to 3*f* are schematic views showing the remaining steps of the method of making the membrane probe card according to the second preferred embodiment of the present invention.
Figure 3E:
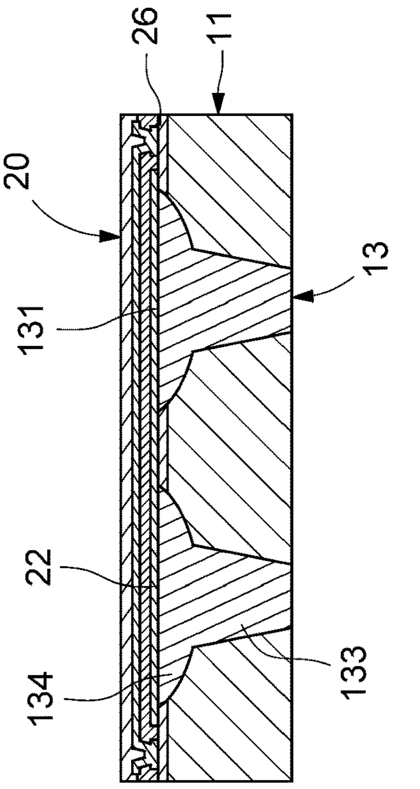
Figure 3A:
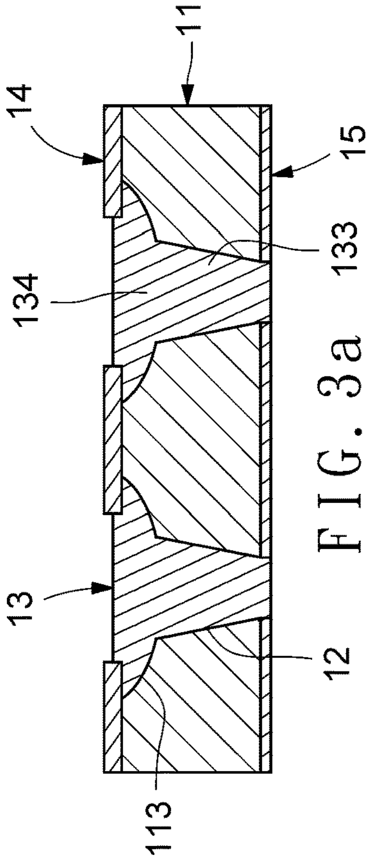
Figure 3B:
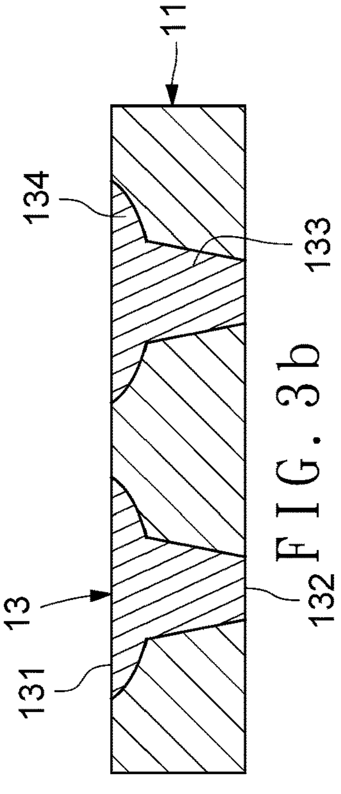
Figure 3C:
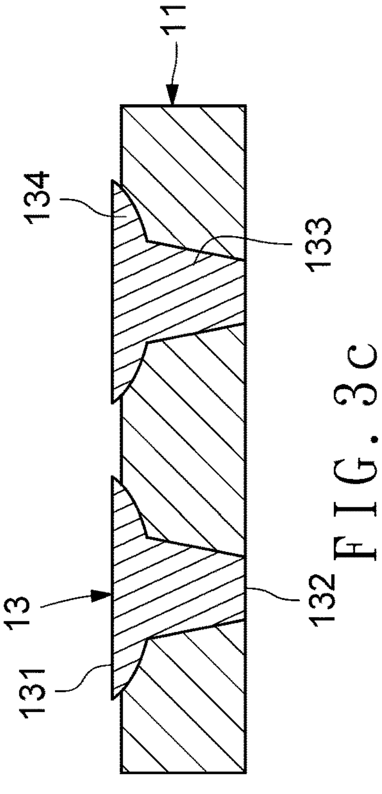
Figure 3F:
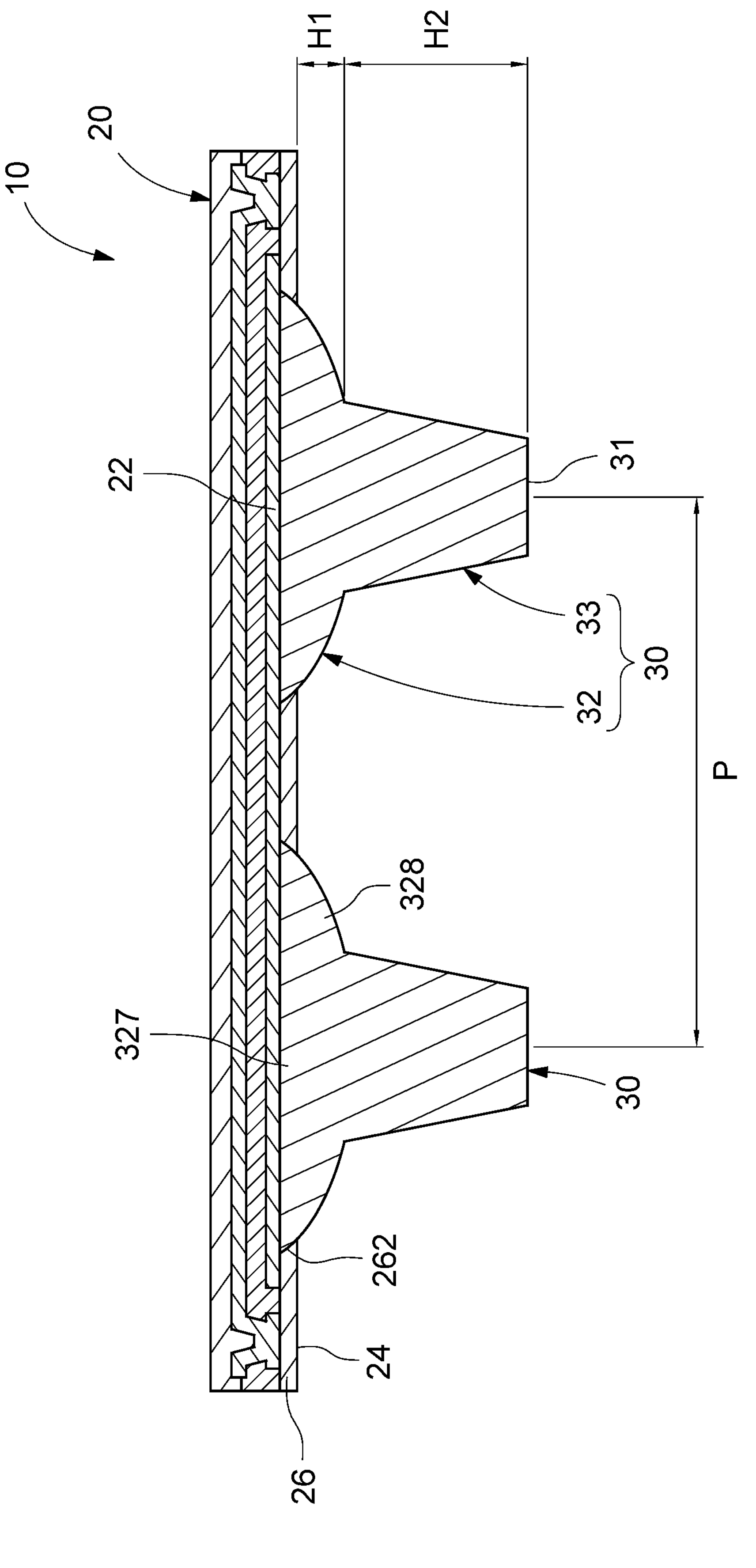

Referring to FIGS. 2*a* to 3*f*, the manufacturing method of a membrane probe card provided by a second preferred embodiment of the present invention similarly includes steps a) to e) as described in the first preferred embodiment, such as providing a metal substrate 11 (as shown in FIG. 2*a*), laser processing to form through holes 12 (as shown in FIG. 2*d*), electroplating to form conductive bodies 13 in the through holes 12 (as shown in FIG. 3*a*), arranging the membrane wiring structure 20 (as shown in FIGS. 3*d* and 3*e*), and removing the metal substrate 11 (as shown in FIG. 3*f*). However, this embodiment differs from the first preferred embodiment in the following aspects.

As shown in FIG. 2*b*, the step b) of this embodiment further includes forming upper and lower dielectric layers 14, 15 on the upper and lower surfaces 111, 112 of the metal substrate 11, respectively. The upper dielectric layer 14 is formed by coating liquid dielectric material or attaching a dielectric material film to the upper surface 111 of the metal substrate 11. The dielectric material can be a high-frequency dielectric material, such as polyimide. The lower dielectric layer 15 is an anti-electroplating photoresist layer adhered to the lower surface 112 of the metal substrate 11. The upper and lower dielectric layers 14, 15 can be formed by double-sided photoresist exposure and development, allowing the upper dielectric layer 14 to have predetermined openings 141 at predetermined positions to define the positions of the subsequent probe bases 32 to be formed (as shown in FIG. 3*f*).

Then, as shown in FIGS. 2*c* and 2*d*, the step b) of the present embodiment first utilizes micro-etching to form a plurality of recesses 113 on the upper surface 111 of the metal substrate 11, and then utilizes laser processing to form through holes 12 penetrating through the bottoms of the recesses 113. The openings 141 of the upper dielectric layer 14 and the recesses 113 are communicated with each other in a one-to-one manner, and the cross-sectional area of each recess 113 is greater than that of the associated one opening 141. The recesses 113 of the metal substrate 11 and the through holes 12 are communicated with each other in a one-to-one manner, and the cross-sectional area of each recess 113 is greater than that of each through hole 12.

Figure 4A:
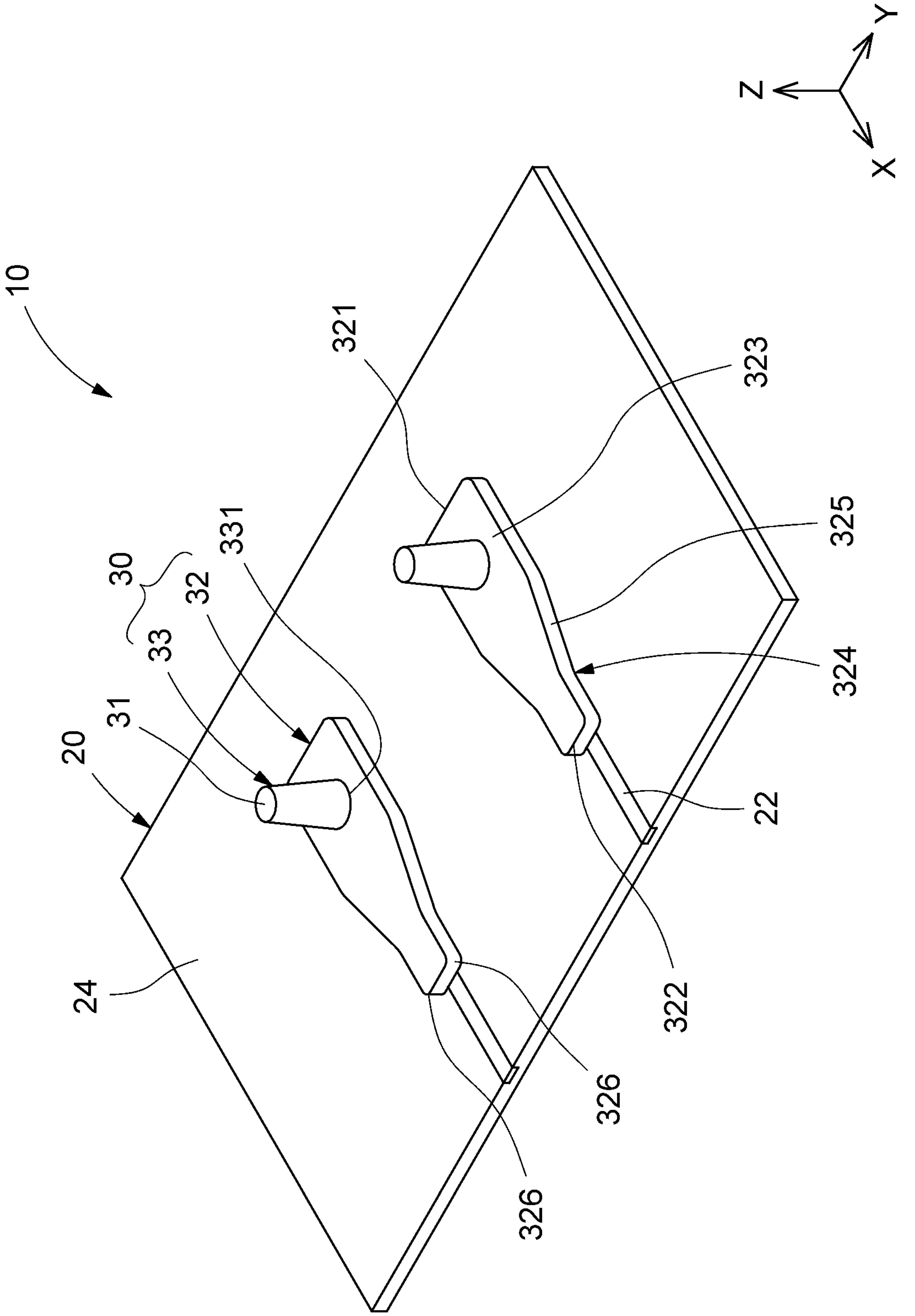
FIG. 4*a* is a schematically perspective view of a membrane device of the membrane probe card provided by the second preferred embodiment of the present invention.

It should be noted that the probes 30 to be formed in this embodiment are as shown in FIGS. 3*f* and 4*a*, including a base 32 and a probe tip 33. Each probe 30 defines height, length, and width axes, which are perpendicular to each other and are defined based on the shape of each probe 30 to define the dimensions of the probe 30 subsequently. The two probes 30 shown in FIG. 4*a* not only have the same shape but are also arranged in the same orientation, so the defined axes of the two probes 30 are the same. The height axis of the probes 30 shown in FIG. 4*a* is the Z-axis, the length axis is the X-axis, and the width axis is the Y-axis. According to the coordinate axis shown in FIG. 4*a*, the cross-sectional area mentioned in the present invention is the cross-sectional area on the X-Y plane. However, the probes 30 on the membrane device 10 of the membrane probe card may not all be arranged in the same orientation, so there may be different length and width axes.

The shapes of the base 32 and the probe tip 33 of the probe 30 are defined respectively by the aforementioned recesses 113 and through holes 12. Therefore, the depth of the recesses 113 formed by micro-etching in FIG. 2*c* will define the height of the base 32 in the height axis, and the shape of the recesses 113 in the length and width axes is as shown in FIG. 2*e*, corresponding to the shape of the base 32 shown in the X-Y plane in FIG. 4*a*.

As shown in FIG. 3*a*, the step c) in this embodiment is to form conductive bodies 13 in each through hole 12 and the corresponding recess 113, so that each conductive body 13 includes a tip portion 133 located within the through hole 12 and a base portion 134 located within the recess 113. Each conductive body 13 may be partially formed within the upper dielectric layer 14 and the lower dielectric layer 15. Before the step d) is performed, double-sided grinding is performed to remove the upper dielectric layer 14 and the lower dielectric layer 15, and the top surface 131 and the bottom surface 132 of the conductive body 13 are also ground to be smoother, as shown in FIG. 3*b*.

As shown in FIG. 3*c*, in step d) of this embodiment, the metal substrate 11 is first subjected to a micro-etching process, so that the base portions 134 of the conductive bodies 13 protrude partially from the metal substrate 11. Then, a surface dielectric layer 26 of the membrane wiring structure 20 is formed on the metal substrate 11, as shown in FIG. 3*d*. At this time, the portions of the base portions 134 of the conductive bodies 13 protruding from the metal substrate 11 are located within the surface dielectric layer 26, but the top surfaces 131 of the conductive bodies 13 are exposed. Subsequently, the remaining parts of the membrane wiring structure 20 are arranged on the surface dielectric layer 26, as shown in FIG. 3*e*.

Finally, in step e), after removing the metal substrate 11, the membrane device 10 of the membrane probe card as shown in FIGS. **3*f* and 4*a* is formed. In step e) of the manufacturing method of the present invention, the metal substrate 11** may be removed by etching.

By the technical feature of forming the recesses 113 first in step b) and then using laser processing to form the through holes 12 within the recesses 113, the probes 30 formed by the conductive bodies 13 will have probe tips 33 and bases 32 formed respectively by the tip portions 133 and base portions 134. In this embodiment, micro-etching can form recesses 113 of appropriate size, so that the manufactured probes 30 can still meet the requirement of fine pitch. Moreover, since the base 32 and probe tip 33 of each probe 30 are formed simultaneously in step c), there is no segmented stacking interface between the base 32 and the probe tip 33. This prevents the connection portion between the probe tip 33 and the base 32 from easily breakage under stress. In the case where the probe 30 in this embodiment is made of a single material, the base 32 and the probe tip 33 are integrally formed, resulting in good structural strength. The manufacturing methods and membrane devices 10 provided by other embodiments of the present invention and detailedly described hereunder may have the technical features and effects resulted by simultaneously forming the bases 32 and the probe tips 33, and will not be repeatedly illustrated in detail below.

Referring to FIGS. **3*f* and 4*a*, the membrane device 10 of the membrane probe card includes a membrane wiring structure 20 and probes 30 protruding from a probe protruding surface 24 of the membrane wiring structure 20. Each probe 30 includes a base 32 and a probe tip 33. To simplify the illustration and facilitate explanation, the membrane wiring structure 20 is schematically depicted in FIG. 4*a* as a thin rectangular member, and FIG. 4*a* schematically shows two traces 22** only for subsequent explanation of the structural feature.

As shown in FIG. **3*f*, the base 32 of the probe 30 is partially embedded in the surface dielectric layer 26 of the membrane wiring structure 20. That is, the base 32 includes an inner embedded portion 327 embedded in the surface dielectric layer 26 and an outer exposed portion 328 protruding from the surface dielectric layer 26. The cross-sectional areas of the inner embedded portion 327 along the length axis and the width axis are greater than that of the outer exposed portion 328 along the length axis and the width axis, and the traces 22 are connected to the bases 32 of the probes 30. Furthermore, the surface dielectric layer 26 includes a probe protruding surface 24 and a plurality of embedded grooves 262 located on the probe protruding surfaces 24. Each base 32 of the probe 30 is partially embedded in the embedded groove 262 of the surface dielectric layer 26**.

In this way, the base 32 of the probe 30 is partially embedded in the surface dielectric layer 26 of the membrane wiring structure 20, which allows the connection between the probe 30 and the membrane wiring structure 20 to be more secure. Additionally, the inner embedded portions 327 of adjacent probes 30 are separated by the surface dielectric layer 26, maintaining the pitch P between adjacent probes 30 and avoiding the positions of the probe tips 33 of the probes 30 from offset or misalignment due to manufacturing issues in the manufacturing process. Moreover, the feature of partially embedding the base 32 of the probe 30 in the membrane wiring structure 20 can further enhance the structural strengths of the base 32 and the membrane wiring structure 20, thereby preventing the traces 22 from breakage due to excessive stress exerting on the connection portion between the base 32 and the membrane wiring structure 20.

The structural features and effects of the membrane device 10 of the membrane probe card in this embodiment are further explained below. In other embodiments of the present invention, as long as the probe 30 includes a base 32 and a probe tip 33, these structural features can be applied, enabling the membrane device 10 of each embodiment of the membrane probe card to achieve corresponding effects.

Figure 4B:
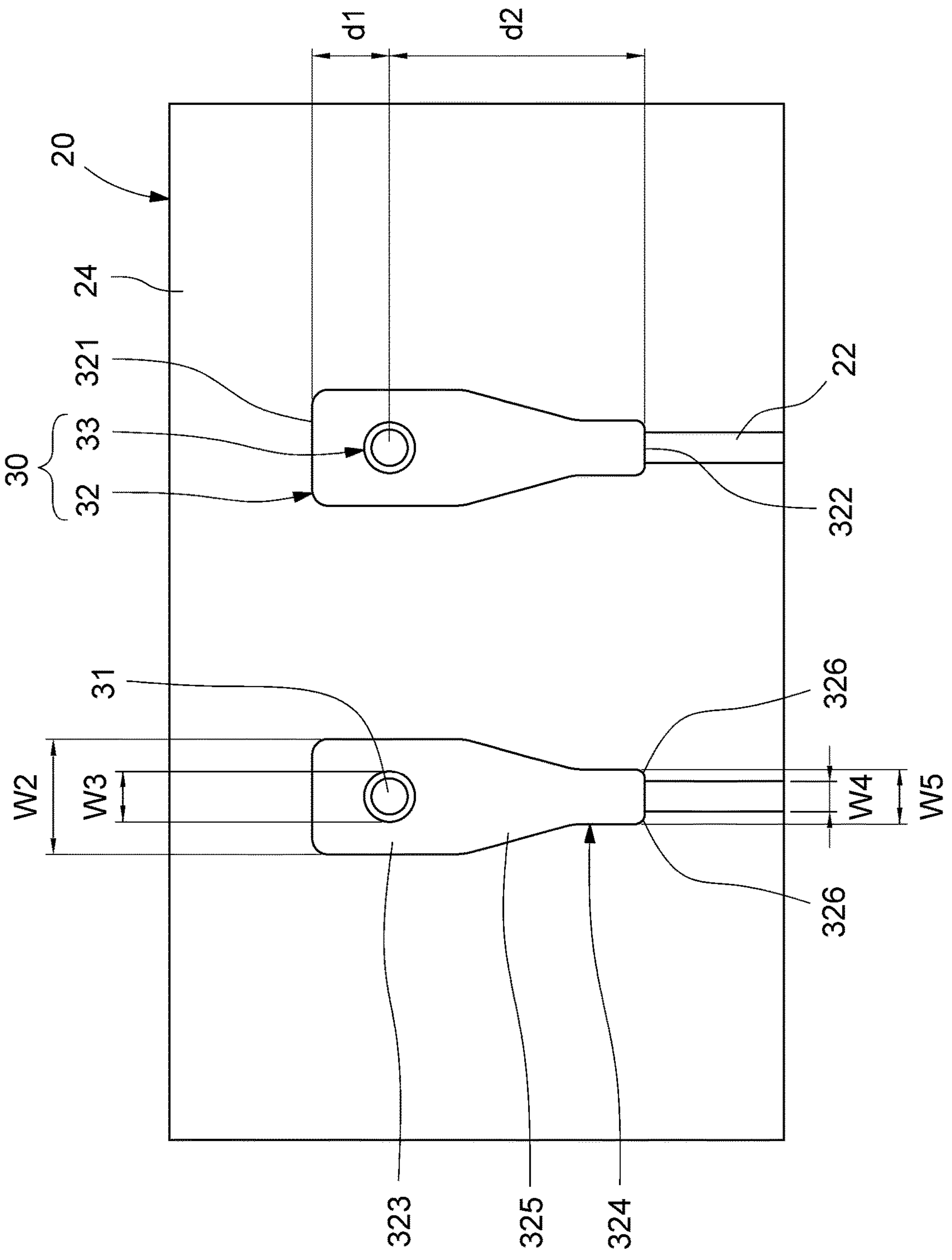
FIG. 4*b* is a top view of FIG. 4*a;*
Figure 4C:
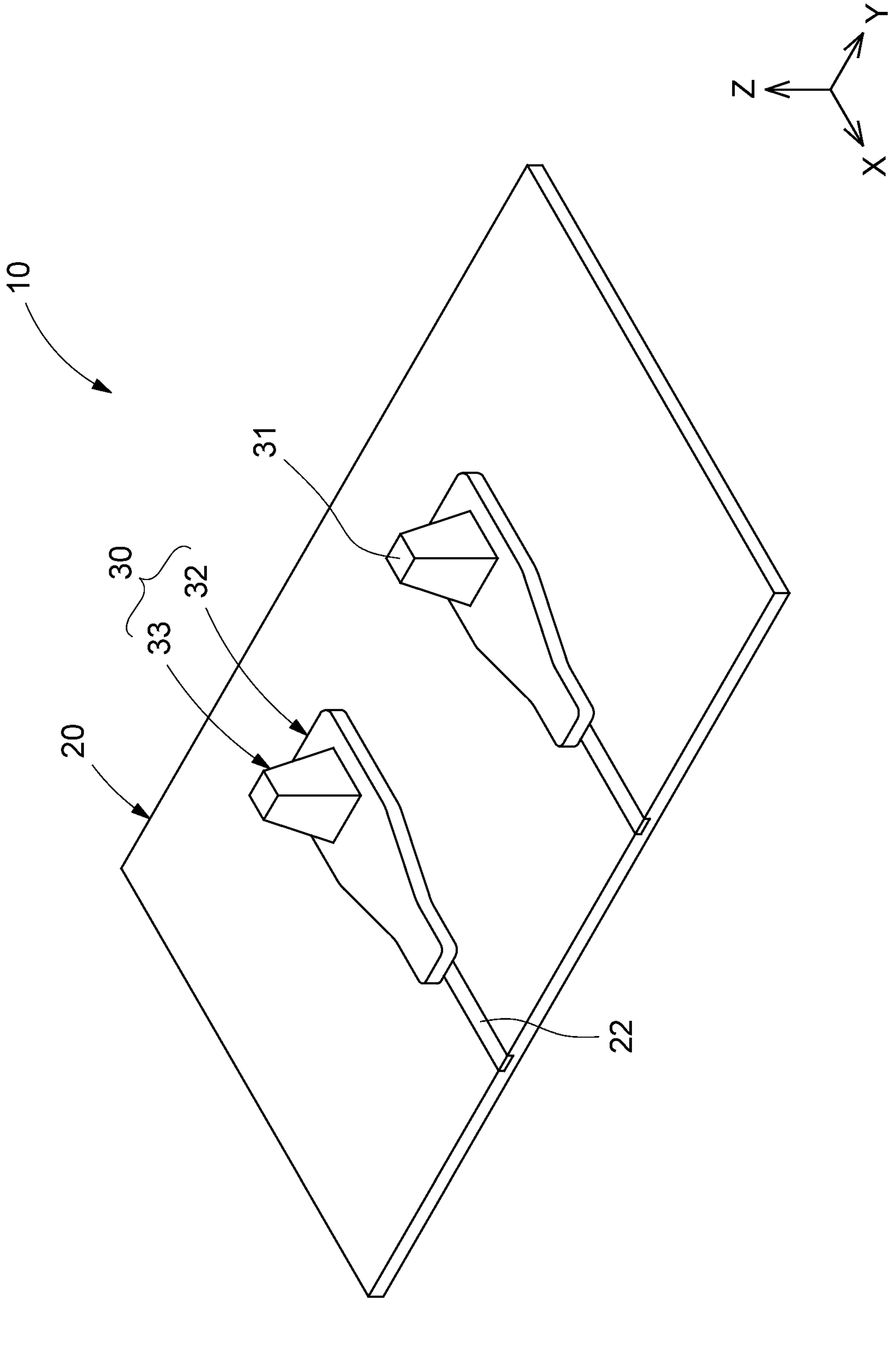
FIG. 4*c* is similar to FIG. 4*a*, but showing a different shape of the probe tip.

Referring to FIGS. **3*f*, 4*a*, and 4*b*, the base 32 is connected with the trace 22 of the membrane wiring structure 20 and protrudes from the probe protruding surface 24 along the height axis by a first height H1. The base 32 includes a first side edge 321, a second side edge 322 opposite to the first side edge 321, a tip placement section 323 extending from the first side edge 321 along the length axis towards the second side edge 322, and an extension section 324 extending from the tip placement section 323 along the length axis to the second side edge 322. The tip placement section 323 defines a width W2 in the width axis. The probe tip 33 protrudes from the base 32 along the height axis by a second height H2 and is electrically connected with the trace 22 of the membrane wiring structure 20 through the base 32. The probe tip 33 is located at the tip placement section 323 of the base 32 and includes a fixed end portion 331 connected to the base 32. The fixed end portion 331 defines a width W3 in the width axis, where the width W2 of the tip placement section 323 is greater than the width W3 of the fixed end portion 331. Each probe 30 defines a first distance d1 from the center of the probe tip 33 to the first side edge 321 of the base 32 and a second distance d2 from the center of the probe tip 33 to the second side edge 322 of the base 32, where the first distance d1 is smaller than the second distance d2. The center of the tip 33 can be the circular center of the contact end face 31 of the probe 30, as shown in FIG. 4*a*. Furthermore, the center of the probe tip 33 can also be the center of the contact end face 31 of the probe 30, as shown in FIG. 4*c*. For example, when the contact end face 31 is square or rectangular as shown in FIG. 4*c*, the center of the contact end face 31 is the intersection of the two diagonals of the contact end face 31. The probe tip 33 of each probe 30 has a contact end face 31 farthest from the base 32, located between the first side edge 321 and the second side edge 322, with the contact end face 31 closer to the first side edge 321**.

As such, the probe 30 of the membrane probe card of the present invention includes a base 32 protruding from the membrane wiring structure 20 and a probe tip 33 protruding from the base 32. Therefore, the probe height is the sum of the first height H1 of the base 32 and the second height H2 of the probe tip 33. In this way, while achieving the fine pitch requirement, the probes 30 can still have a required probe height for testing, without the problem of poor structural strength caused by exceeding thin and height feature of the probe tips 33. Moreover, during testing, the contact end face 31 of the probe tip 33 of the probe 30 contacts the DUT (Device Under Test), and the probe tip 33 receives a reaction force, which is then transmitted to the base 32. The width of the base 32 is larger than the width of the tip 33, effectively dispersing the reaction force, making the probe 30 less prone to breakage due to force during testing.

However, the high structural strength of the probe 30 may also lead to poor elasticity, possibly causing a problem that it is difficult for the probe tip 33 to scratch through the oxide layer on the surface of the conductive contact pad of the DUT, resulting in unstable testing result. In the membrane device 10 of the membrane probe card of the present invention, the probe tip 33 of the probe 30 is closer to the first side edge 321 of the base 32 than to the second side edge 322, meaning the position of the probe tip 33 on the base 32 is biased towards one side of the base 32. This feature enhances the elasticity of the probe 30, thereby avoiding the problem of the probe tip 33 being unable to scratch through the oxide layer on the DUT, thus improving testing stability.

Due to the high structural strength of the probe 30, the reaction force during testing may be too great, causing damage to the trace 22 connected to the base 32 of the probe 30. Therefore, in this embodiment, the extension section 324 of the base 32 of each probe 30 includes a tapered section 325, which gradually narrows from the tip placement section 323 towards the second side edge 322. This feature reduces the reaction force transmitted from the probe tip 33 to the tapered section 325, preventing the trace 22 of the membrane wiring structure 20 from damage during testing.

The second side edge 322 of the base 32 of the probe 30 is further away from the probe tip 33, such that the reaction force during testing may be concentrated on the portion of the trace 22 of the membrane wiring structure 20 located at the second side edge 322, which may cause this portion of the trace 22 to break. In this embodiment, the extension section 324 of the base 32 of each probe 30 has two rounded corners 326 located at the second side edge 322. In this way, the aforementioned tapered section 325 has reduced the reaction force transmitted to the extension section 324, and the rounded corners 326 located at the second side edge 322 further evenly distribute the reaction force transmitted to the second side edge 322, thereby preventing breakage of the trace 22 located at the second side edge 322.

In FIG. 4*a*, the trace 22 connected to the base 32 of each probe 30 extends from the second side edge 322 of the base 32. The first side edge 321 of the base 32 can define a width in the width axis, namely the width W2 of the tip placement section 323, as shown in FIG. 4*b*, and the trace 22 can define a width in the width axis, namely the width W4. The width W2 of the first side edge 321 is greater than the width W4 of the trace 22. As the position of the probe tip 33 of the probe 30 is closer to the first side edge 321 of the base 32 and the width W2 of the first side edge 321 is greater than the width W4 of the trace 22, this feature effectively disperses the stress transmitted to the membrane wiring structure 20, avoiding stress concentration on the trace 22, thereby preventing breakage of the trace 22 during testing.

More preferably, the second side edge 322 of the base 32 of each probe 30 can define a width W5 in the width axis, where the width W5 of the second side edge 322 is smaller than the width W2 of the first side edge 321 and larger than the width W4 of the trace 22. As previously described, the high structural strength of the probe 30 may result in too much reactive force during testing, damaging the trace 22 connected to the base 32 of the probe 30. Therefore, the feature of making the width W5 of the second side edge 322 of the base 32 smaller than the width W2 of the first side edge 321 can reduce the reactive force. Additionally, the feature that the width W5 of the second side edge 322 is larger than the width W4 of the trace 22 can still disperse stress transmitted to the membrane wiring structure 20, avoiding stress concentration on the trace 22 and effectively preventing the trace 22 from breakage during testing.

More preferably, the width W3 of the fixed end portion 331 of the probe tip 33 is greater than the width W4 of the trace 22. This feature allows the reactive force received by the probe tip 33 to be moderately dispersed before being transmitted to the base 32 and then further dispersed to the membrane wiring structure 20 more effectively through the effect of stress dispersion by the base 32 mentioned earlier, thus effectively avoiding stress concentration on the trace 22 and more effectively preventing the trace 22 from breakage.

As mentioned earlier, the probe tip in the present invention can (but not limited to) be conical, such as the truncated conical probe tip 33 shown in FIG. 4*a*, or may also be a truncated square-based pyramidal probe tip 33 as shown in FIG. 4*c*, depending on the usage requirements.

Figure 5D:
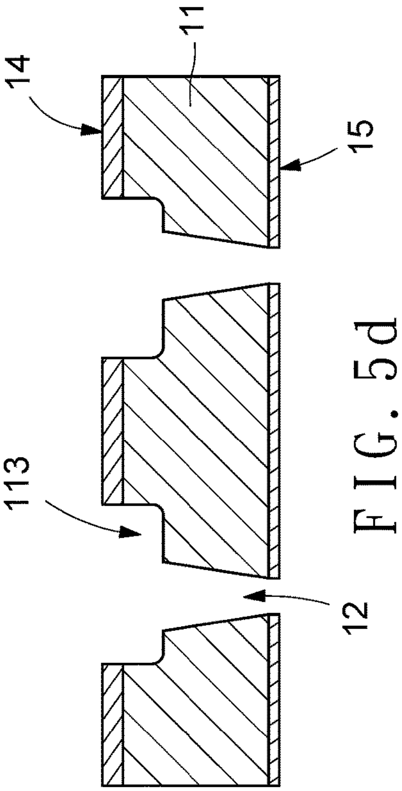
FIGS. 5*a* to 5*h* are schematic views showing the steps of a method of making a membrane probe card according to a third preferred embodiment of the present invention.
Figure 5E:
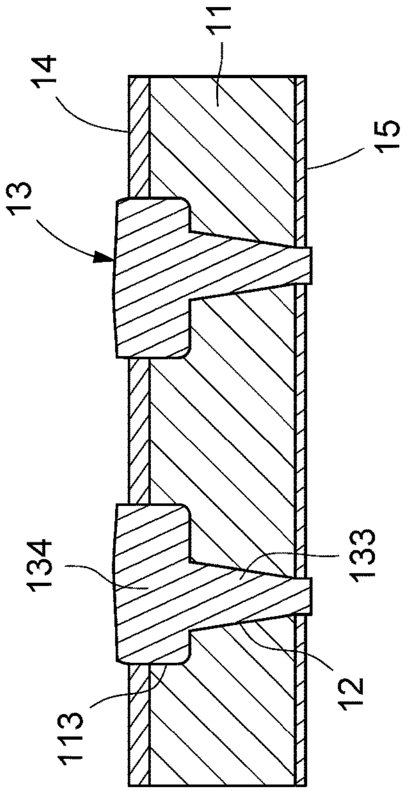
Figure 5A:
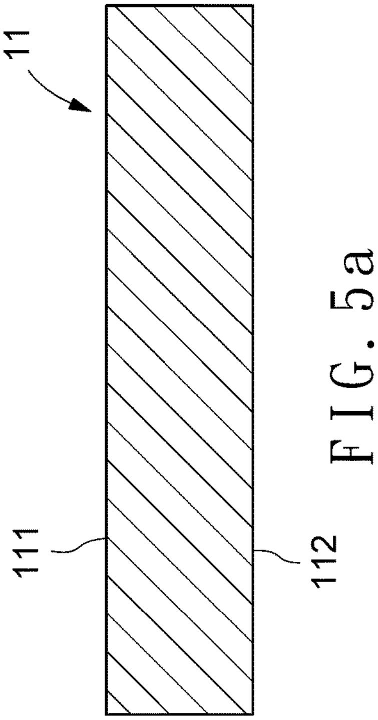
Figure 5B:
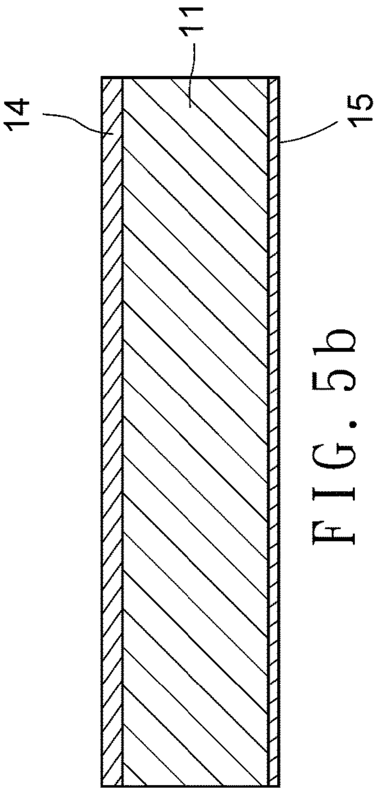
Figure 5C:
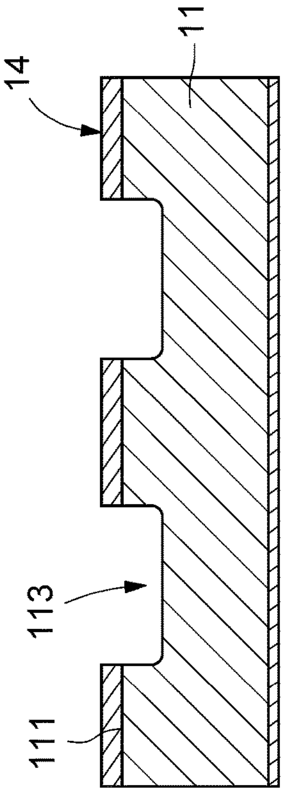
Figure 5F:
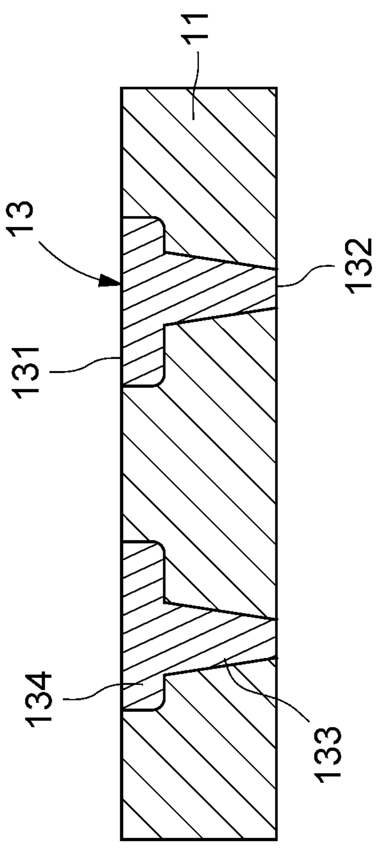
Figure 5G:
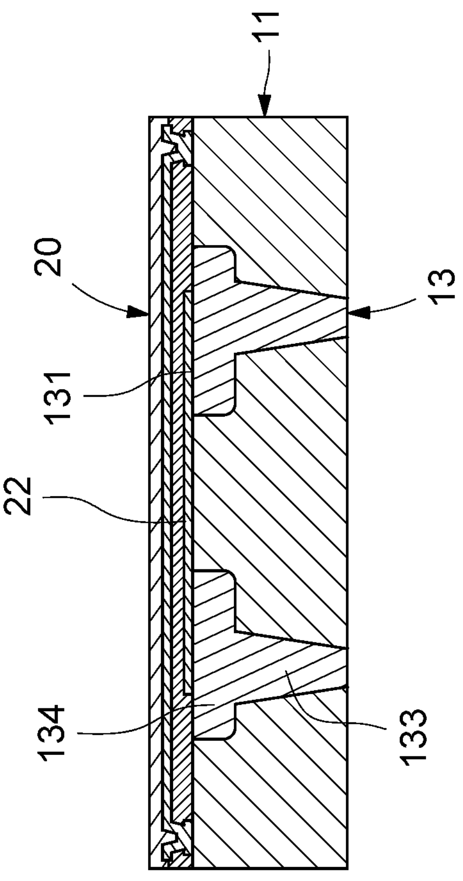
Figure 5H:
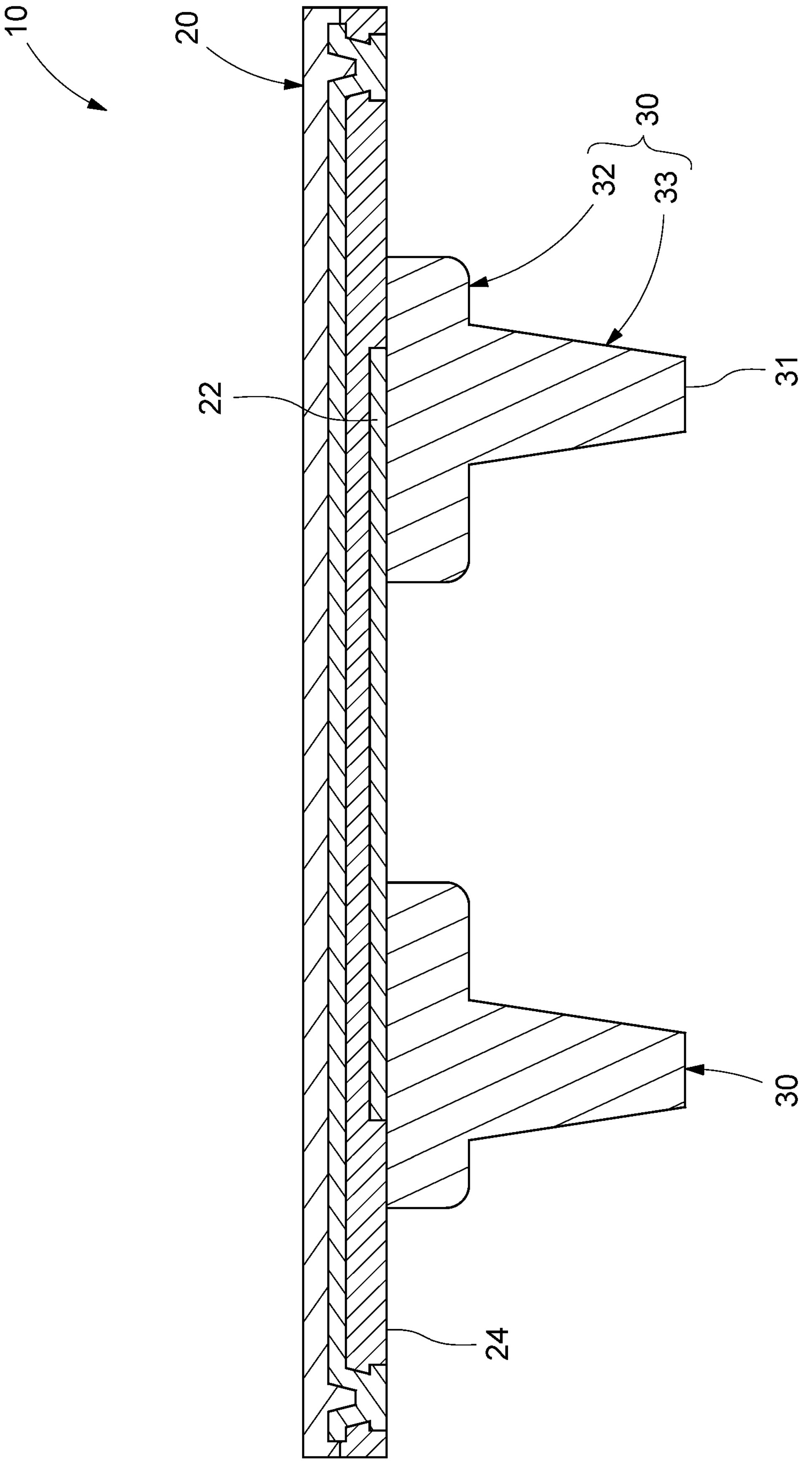

Referring to FIGS. 5*a* to 5*h*, the manufacturing method of a membrane probe card provided by a third preferred embodiment of the present invention also includes steps a) to e) as described in the first preferred embodiment, such as providing a metal substrate 11 (as shown in FIG. 5*a*), laser processing to form through holes 12 (as shown in FIG. 5*d*), electroplating to form conductive bodies 13 in the through holes 12 (as shown in FIG. 5*e*), arranging the membrane wiring structure 20 (as shown in FIG. 5*g*), and removing the metal substrate 11 (as shown in FIG. 5*h*). The membrane device 10 of the membrane probe card and its manufacturing method in this embodiment are similar to those provided in the second preferred embodiment, and the same technical features and corresponding effects are not repeatedly illustrated here. The differences are detailedly recited hereunder.

As shown in FIG. 5*b*, the step b) in this embodiment includes forming upper and lower dielectric layers 14 and 15 on the upper and lower surfaces 111 and 112 of the metal substrate 11, respectively. This part is similar to the second preferred embodiment, but in this embodiment, the upper dielectric layer 14 does not have openings during formation. Instead, as shown in FIG. 5*c*, the upper dielectric layer 14 and the metal substrate 11 are laser processed simultaneously to form recesses 113 on the upper surface 111 of the metal substrate 11. Then, through holes 12 are formed in the recesses 113 using laser processing, as shown in FIG. 5*d*. Subsequently, the step c) forms a conductive body 13 in each through hole 12 and an associated recess 113 thereof, so that each conductive body 13 includes a tip portion 133 inside the through hole 12 and a base portion 134 inside the recess 113, as shown in FIG. 5*e*. In other words, in this embodiment, recesses 113 are first formed, followed by laser processing to form through holes 12 within the recesses 113. However, in this embodiment, the recesses 113 are formed by laser processing, such that the shape and size of the recesses 113 can be easily controlled, and after the recesses 113 are completed, the laser processing can be continued to form the through holes 12, thus achieving good processing efficiency.

As shown in FIG. 5*f*, similar to the second preferred embodiment, before step d), double-sided grinding is also performed in this embodiment to remove the upper and lower dielectric layers 14 and 15 and make the top surface 131 and the bottom surface 132 of the conductive bodies 13 smoother.

As shown in FIGS. 5*g* to 5*h*, the steps d) and e) in this embodiment are the same as those in the first preferred embodiment (as shown in FIGS. 1*d* to 1*e*), thus achieving the same effects. However, in the completed membrane device 10 of the membrane probe card in this embodiment, the probe 30 includes a base 32 and a probe tip 33, thus achieving similar effects as in the aforementioned second preferred embodiment.

Figure 6A:
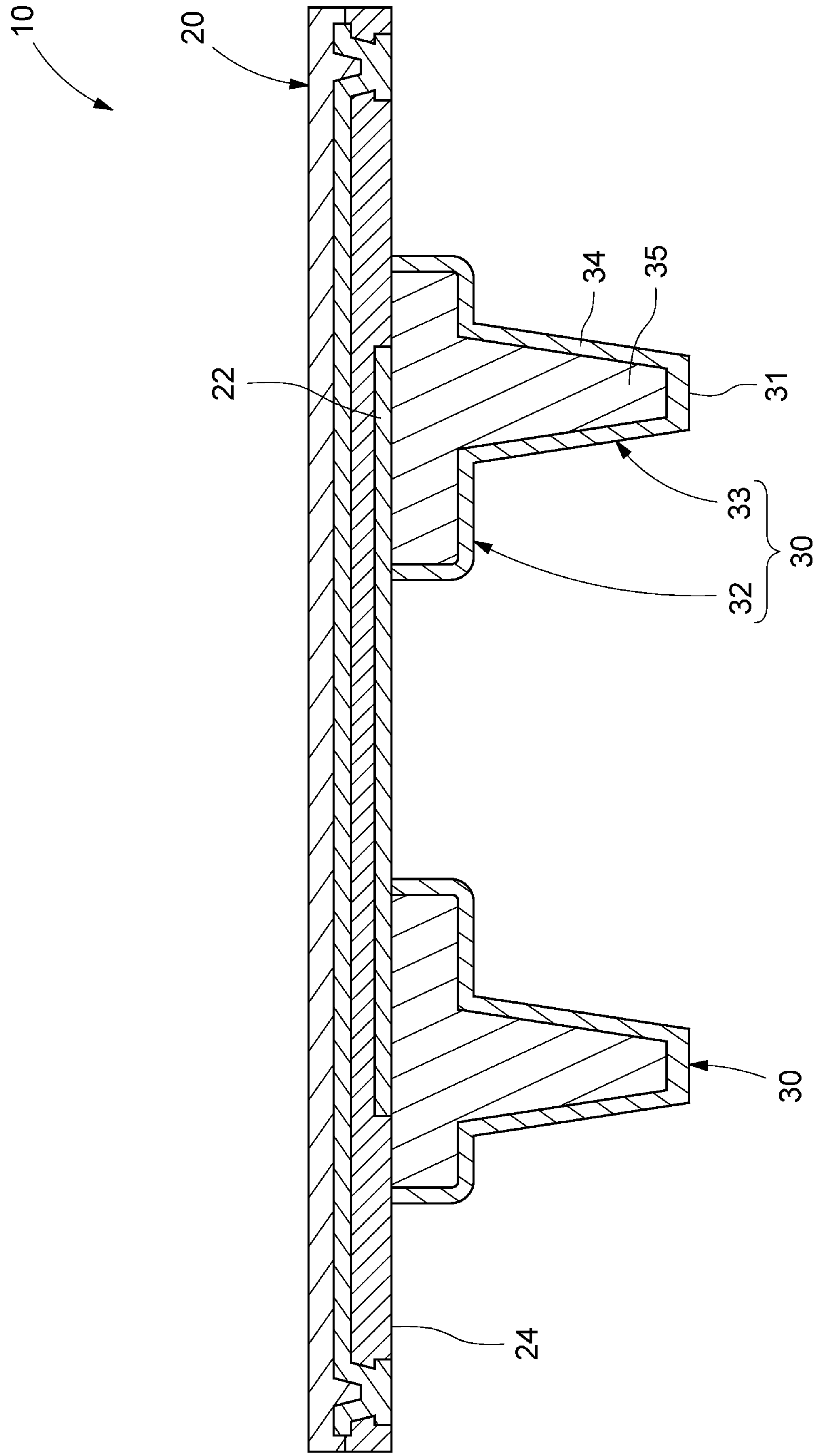
FIG. 6*a* is a schematic cross-sectional view of a membrane device of a membrane probe card provided by a fourth preferred embodiment of the present invention.

Referring to FIG. 6*a*, the membrane device 10 of the membrane probe card provided by a fourth preferred embodiment of the present invention is similar to the membrane device 10 shown in FIG. 5*h*. However, in this embodiment, each probe 30 includes an outer layer 34 exposed to the outside and an inner layer 35 shielded by the outer layer

34. The outer layer 34 and the inner layer 35 are made of different metals, and both extend from the probe tip 33 to the base 32.

Figure 6B:
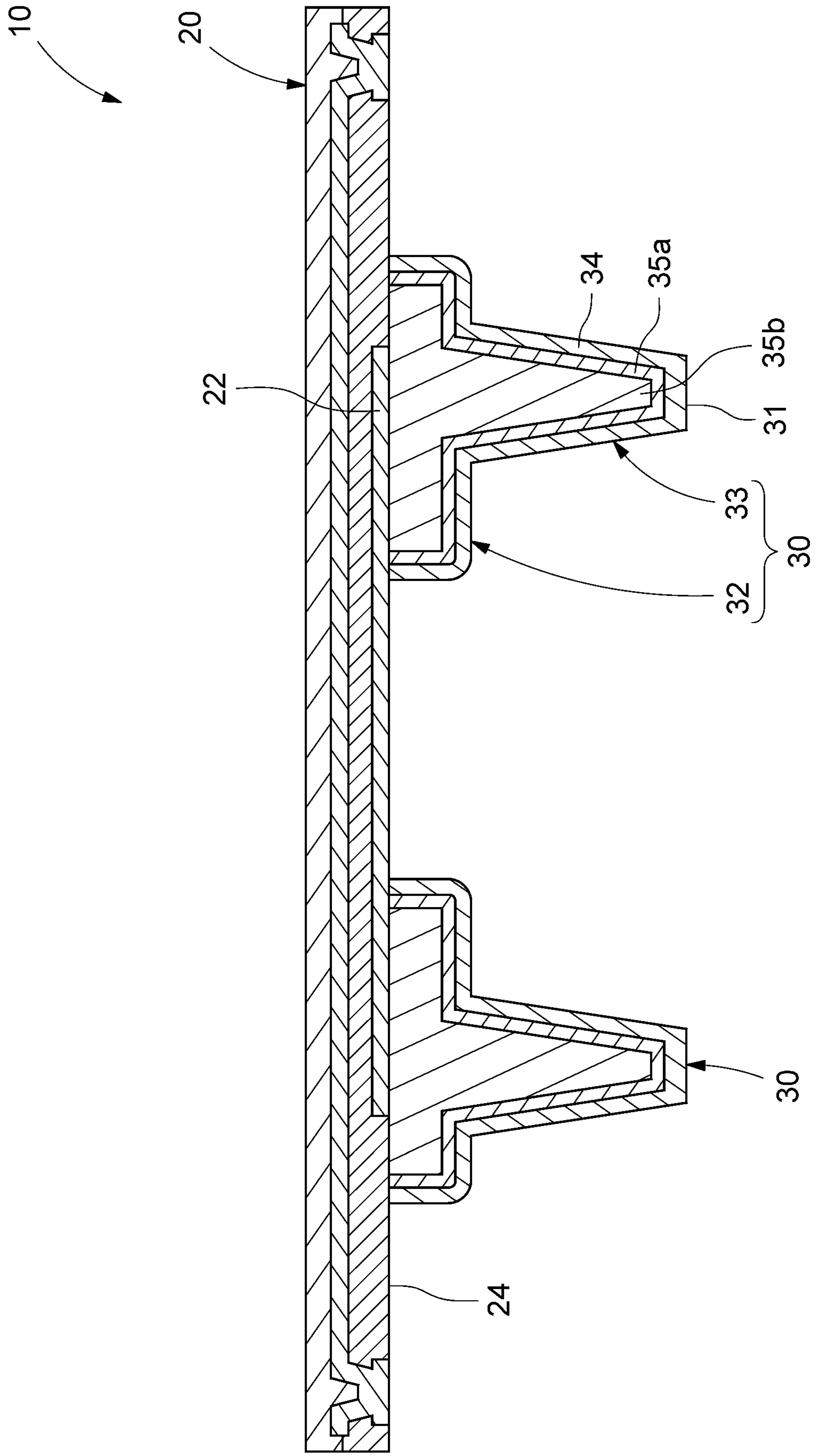
FIGS. 6*b* and 6*c* are similar to FIG. 6*a*, but showing different internal structures of the probe.

Specifically, the manufacturing method of the membrane probe card in this embodiment is similar to that provided in the third preferred embodiment. However, in step c) of electroplating to form the conductive body 13 as shown in FIG. 5*e*, the conductive body 13 is formed in layers by using two different materials in two electroplating processes, resulting in that the outer layer 34 and the inner layer 35 of the completed probe 30 are made of the two different materials, respectively. For example, electroplating can be performed first with ruthenium followed by nickel, resulting in the outer layer 34 and the inner layer 35 of the completed probe 30 being made of ruthenium and nickel, respectively. Furthermore, the outer layer 34 of the probe 30 can be made of a metal with greater hardness, such as ruthenium or palladium-cobalt alloy, to improve the wear resistance of the probe 30, while the inner layer 35 of the probe 30 can be made of a metal with different properties as needed, such as nickel with good oxidation resistance or copper with good conductivity. As shown in FIG. 6*b*, the probe 30 can also have multiple inner layers 35*a*, 35*b*, which can be made of metals with different properties as needed. For example, the inner layer 35*b* can be made of a metal with good conductivity, such as copper, while the inner layer 35*a* can be made of a metal with good oxidation resistance, such as nickel or a nickel-cobalt alloy.

The outer layer 34 and the inner layers 35, 35*a*, 35*b* all extend from the probe tip 33 to the base 32. This feature indicates that each of the outer layer 34 and the inner layers 35, 35*a*, 35*b* is formed simultaneously with its portions located at the probe tip 33 and the base 32, so that there are no segmented stacking interfaces between the probe tip 33 and the base 32, making the connection portion between the probe tip 33 and the base 32 less prone to breakage due to stress. Furthermore, although the probe 30 has a layered structure internally, the layers are inner and outer layers rather than upper and lower layers. The portions of the probe tip 33 and the base 32 in each layer are integrally formed, so that the connection portion between the probe tip 33 and the base 32 is less prone to breakage due to stress.

Figure 6C:
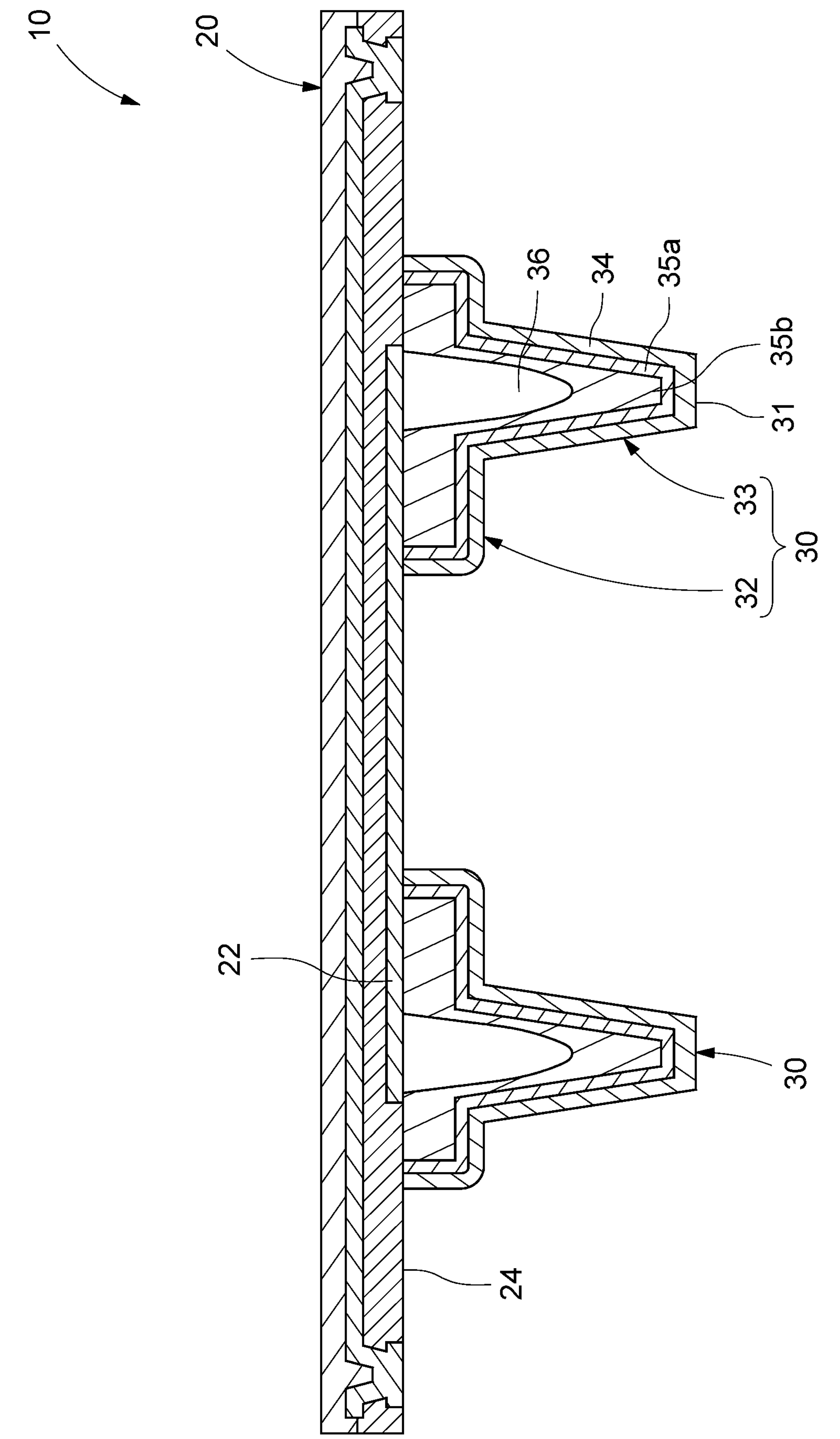

As shown in FIG. 6*c*, each probe 30 may further include a space 36 inside an inner layer 35*b*. More specifically, the innermost layer of the probe 30 may be hollow and unfilled, creating a space 36 inside. In other words, even in the case where there is only a single inner layer 35 as shown in FIG. 6*a*, the inner layer 35 can also be hollow. This reduces the stress transmitted from the probe tip 33 to the membrane wiring structure 20, avoiding the fracture of the traces 22 due to excessive stress. In addition, with the space 36 inside the probe 30, portions of the traces 22 of the membrane wiring structure 20 can extend partially into the space 36 inside the base 32, or even further into the space 36 inside the probe tip 33. The portions of the traces 22 inside the probe 30 and those outside the probe 30 can be integrally formed without segmented stacking interfaces, thereby not only enhancing the structural strength of the traces 22 themselves but also protecting the traces 22 by the base 32, thereby reducing the impact of stress on the traces 22.

The structural features of the aforementioned probe 30, including the space 36 and/or the inner layer 35, 35*a*, 35*b*, and the outer layer 34, can be applied in various embodiments of the present invention, enabling the probes 30 of each embodiment to have the aforementioned effects.

Figure 7D:
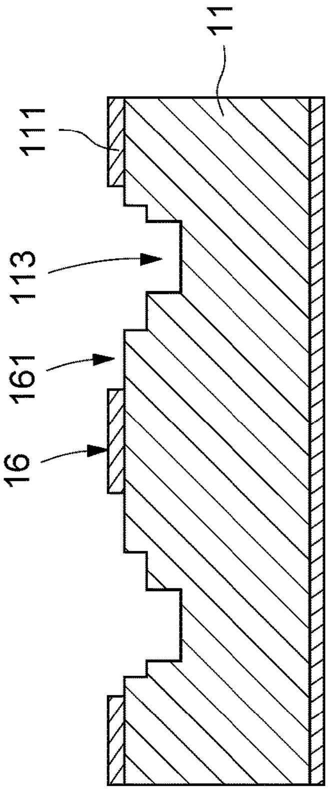
FIGS. 7*a* to 7*i* are schematic views showing the steps of a method of making a membrane probe card according to a fifth preferred embodiment of the present invention.
Figure 7E:
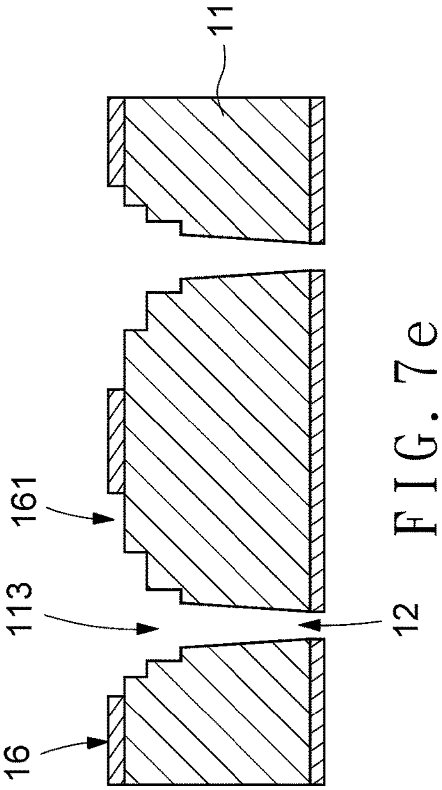
Figure 7A:
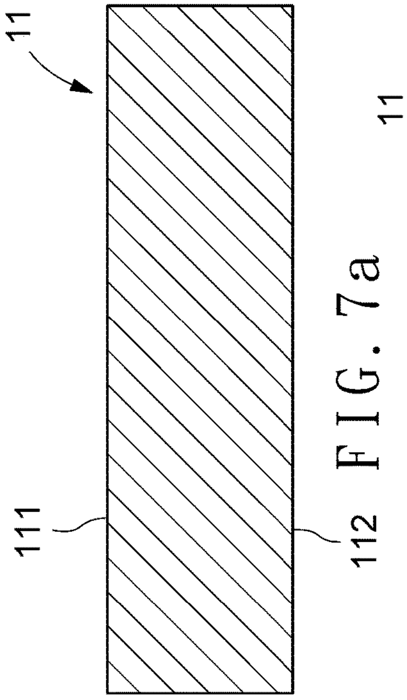
Figure 7B:
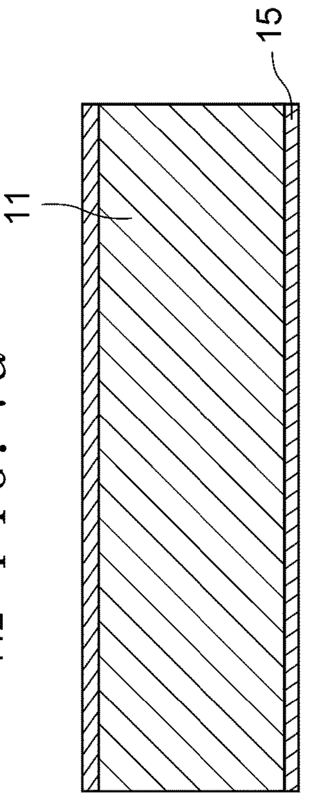
Figure 7C:
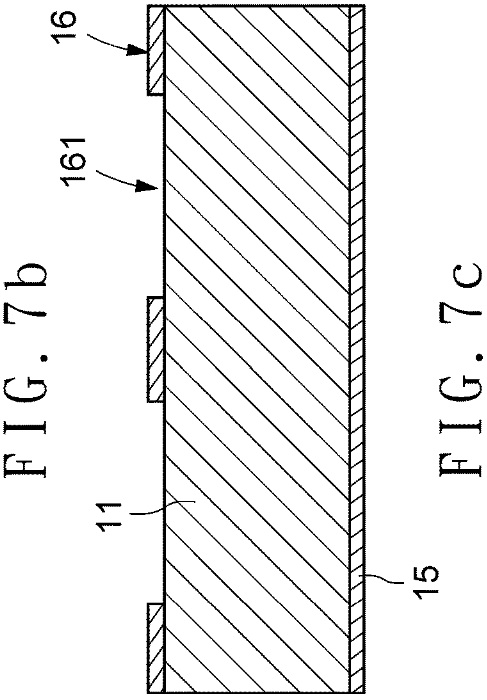
Figure 7H:
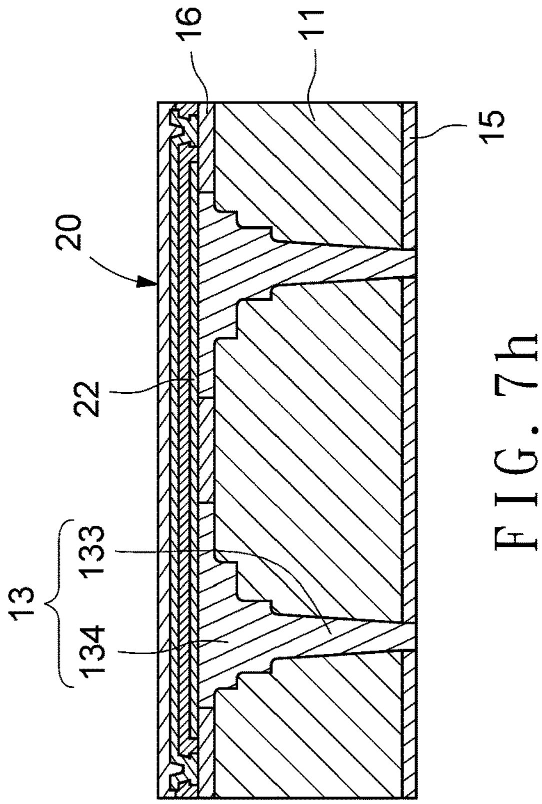
Figure 7I:
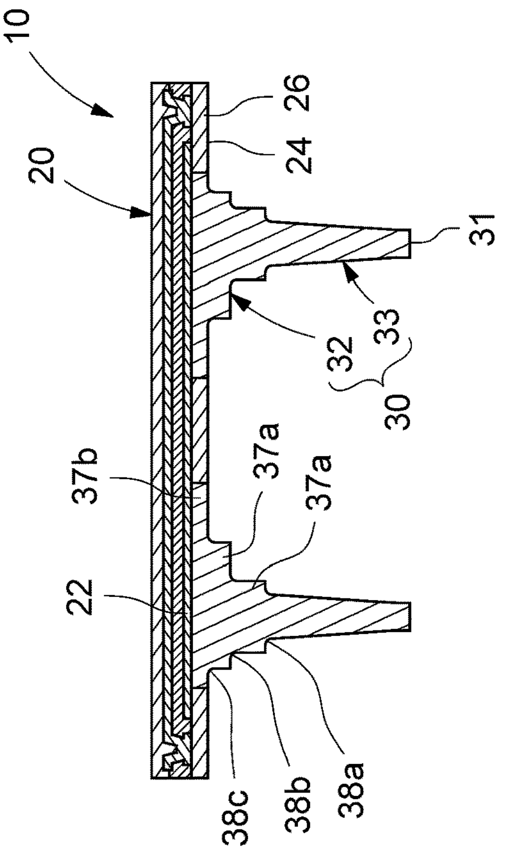
Figure 7F:
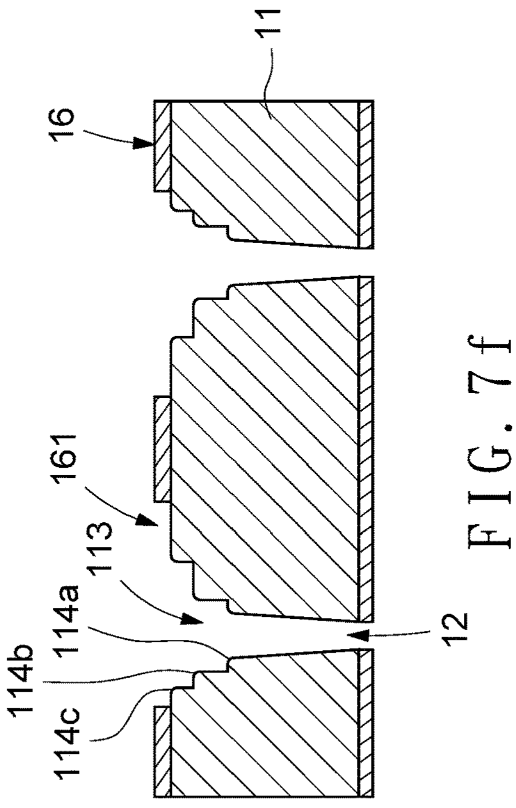
Figure 7G:
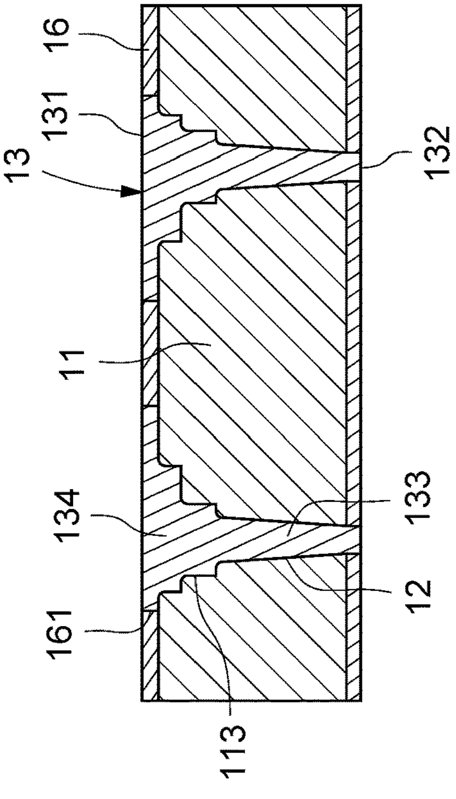

Referring to FIGS. 7*a* to 7*i*, the manufacturing method of a membrane probe card provided by a fifth preferred embodiment of the present invention similarly includes steps a) to e) as described in the first preferred embodiment, such as providing a metal substrate 11 (as shown in FIG. 7*a*), laser processing to form through holes 12 (as shown in FIG. 7*e*), electroplating to form conductive bodies 13 in the through holes 12 (as shown in FIG. 7*g*), arranging a membrane wiring structure 20 (as shown in FIG. 7*h*), and removing the metal substrate 11 (as shown in FIG. 7*i*). The membrane device 10 and its manufacturing method in this embodiment are similar to those provided in the third preferred embodiment mentioned above, and the same technical features and corresponding effects are not repeatedly illustrated here. The differences are detailedly described as follows.

As shown in FIG. 7*b*, the step b) in this embodiment includes forming an upper dielectric layer and a lower dielectric layer 15 on the upper and lower surfaces 111, 112 of the metal substrate 11, respectively. This part is similar to the third preferred embodiment, but in this embodiment, both the upper dielectric layer and the lower dielectric layer 15 are anti-electroplating photoresist layers. In FIG. 7*c*, only the upper dielectric layer is laser processed to form a patterned dielectric layer 16, and the patterned dielectric layer 16 is provided with multiple openings 161. Subsequently, as shown in FIG. 7*d*, recesses 113 are laser processed on the upper surface 111 of the metal substrate 11 through the openings 161. The openings 161 and the recesses 113 are communicated with each other in a one-to-one manner, with the cross-sectional area of each opening 161 being larger than that of each recess 113. In this embodiment, the recess 113 may (but not limited to) be formed into a stepped shape by secondary laser processing, where the recess 113 will form two base layers 37*a* with different cross-sectional areas of the probe base 32 (as shown in FIG. 7*i*). Subsequently, through holes 12 are formed in the recesses 113 using laser processing, as shown in FIG. 7*e*.

As mentioned in the first preferred embodiment, after step b), micro-etching processing can be performed, during which micro-etching can be carried out on the through holes 12 to make the surface of the manufactured probe 30 smooth and conducive to stable testing, and the micro-etching can also process the connection portions of the through holes 12 and the recesses 113 into round corners 114*a* (as shown in FIG. 7*f*), so that the connection portion 38*a* (as shown in FIG. 7*i*) of the probe tip 33 and the base 32 of the manufactured probe 30 presents a concave rounded shape, or a so-called filleted shape, thereby avoiding stress concentration at the connection portion 38*a* and preventing the probe 30 from breaking. This technical feature described in this section can also be applied in the second to fourth preferred embodiments mentioned above.

Additionally, the micro-etching can also round the sharp corners of the stepped recesses 113 into round corners 114*b* (as shown in FIG. 7*f*), making the connection portion 38*b* (as shown in FIG. 7*i*) of adjacent base layers 37*a* concave and arc-shaped, or so-call fillet-shaped, thus avoiding stress concentration at the connection portion 38*b* and preventing breakage of the probe 30. Furthermore, micro-etching can also round the corner 114*c* at the connection portion of the recess 113 and the opening 161, making the probe portion formed by the corner 114*c* (i.e., the connection portion 38*c* between the base layers 37*b* and 37*a* as shown in FIG. 7*i*) concave and arc-shaped, or so-called fillet-shaped, thus avoiding stress concentration at the connection portion 38*c* and preventing breakage of the probe 30.

As shown in FIG. 7*g*, step c) of this embodiment involves forming a conductive body 13 in each through hole 12 and its associated recess 113 and opening 161, so that each conductive body 13 includes a tip portion 133 inside the through hole 12 and a base portion 134 inside the recess 113 and the opening 161. Then, as shown in FIGS. 7*h* and 7*i*, the membrane wiring structure 20 is arranged, and then the metal substrate 11 and the lower dielectric layer 15 are removed, thus completing the membrane device 10 of the membrane probe card.

From the foregoing, it can be seen that this embodiment also has the technical feature of first forming the recesses 113 by laser processing and then laser processing the through holes 12 in the recesses 113, and the corresponding effects thereof. Moreover, in the laser processing step of this embodiment, a patterned dielectric layer 16 is formed, which, when the membrane device 10 of the membrane probe card is completed, becomes the surface dielectric layer 26 of the membrane wiring structure 20. The base layer 37*b* of the base 32 of the probe 30 (i.e., the portion of the conductive body 13 formed within the opening 161 of the patterned dielectric layer 16) is embedded in the surface dielectric layer 26 of the membrane wiring structure 20, i.e., the base 32 has an inner embedded portion (i.e., the base layer 37*b*) embedded in the surface dielectric layer 26, and an outer exposed portion (i.e., the two base layers 37*a*) exposed outside the surface dielectric layer 26. This ensures a more stable connection between the probe 30 and the membrane wiring structure 20, and the inner embedded portions (i.e., the base layers 37*b*) of the bases 32 of adjacent probes 30 are separated by the surface dielectric layer 26 of the membrane wiring structure 20, thus maintaining the pitch between adjacent probes 30 and avoiding offset or misalignment of the position of the probe tip 33 due to manufacturing issues. Furthermore, the inner embedded portion (i.e., the base layer 37*b*) and the outer exposed portion (i.e., the two base layers 37*a*) of the base 32 of the probe 30 are formed simultaneously in step c), so the base 32 of the probe 30 does not have segmented stacking interfaces, such that the base 32 is less prone to breakage under stress.

In the membrane device 10 of the membrane probe card in this embodiment, the base 32 of each probe 30 includes multiple base layers 37*a*, 37*b*, with different cross-sectional areas along the length and width axes. Compared to the case with only a single base layer, multiple base layers can gradually reduce the cross-sectional area in the direction from the membrane wiring structure 20 towards the probe tip 33, thereby further increasing the probe height while maintaining the structural strength of the probe tip 33. This technical feature described above can also be applied in the sixth preferred embodiment described below.

Figures 8A, 8B, 8C, 8D, 8E, 8F:
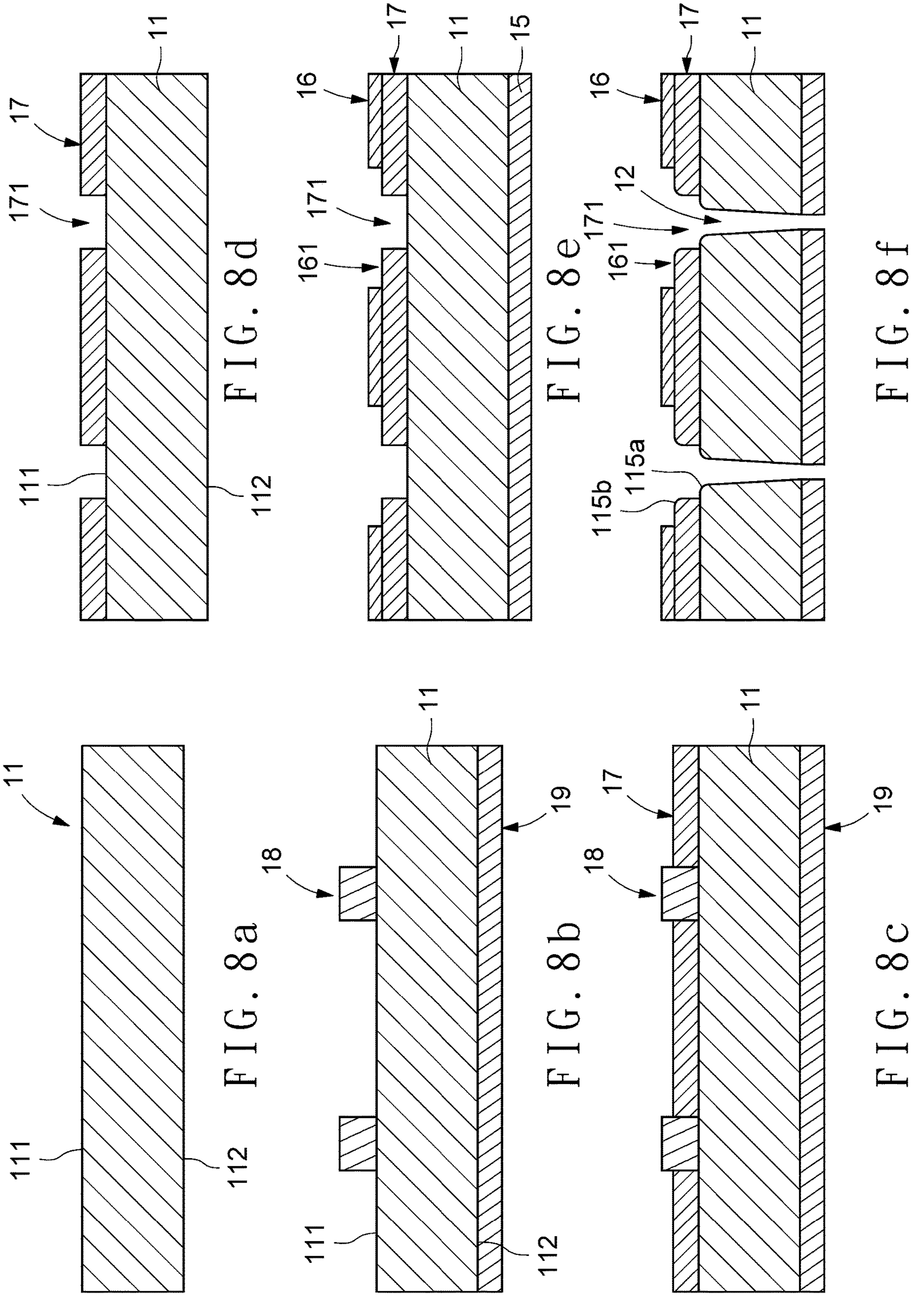
FIGS. 8*a* to 8*j* are schematic views showing the steps of a method of making a membrane probe card according to a sixth preferred embodiment of the present invention.
Figure 8I:
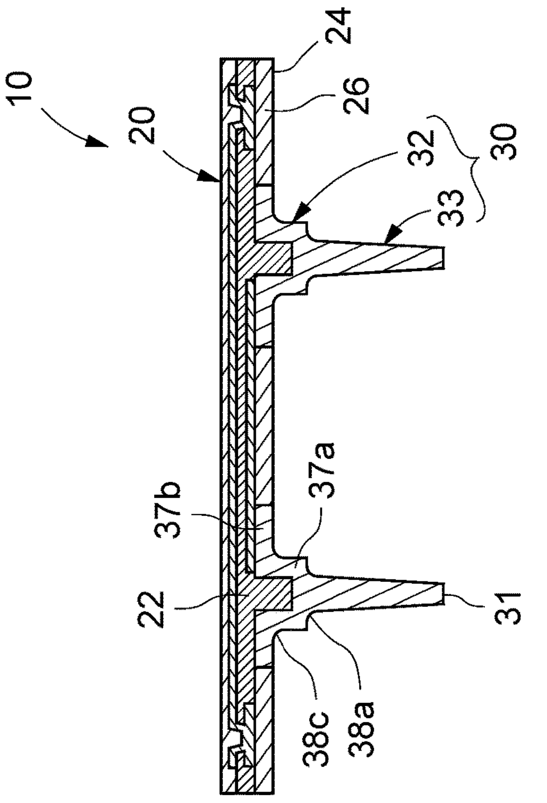
Figure 8J:
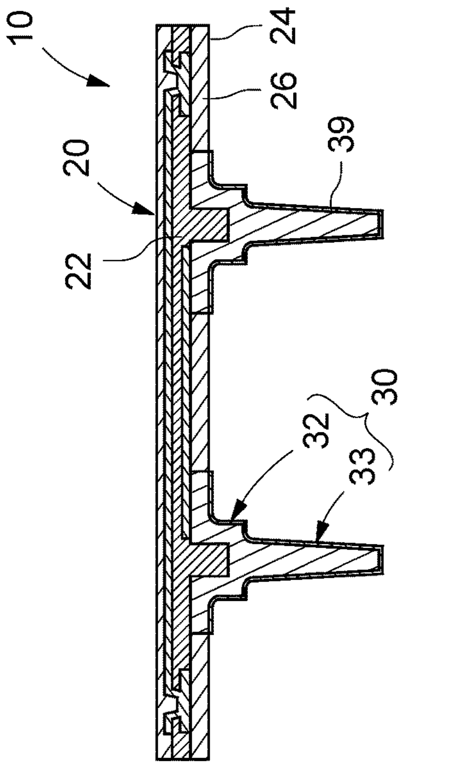
Figure 8G:
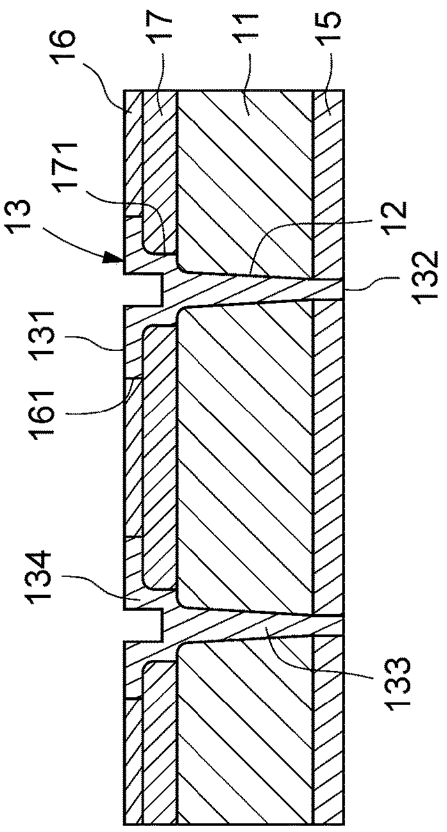
Figure 8H:
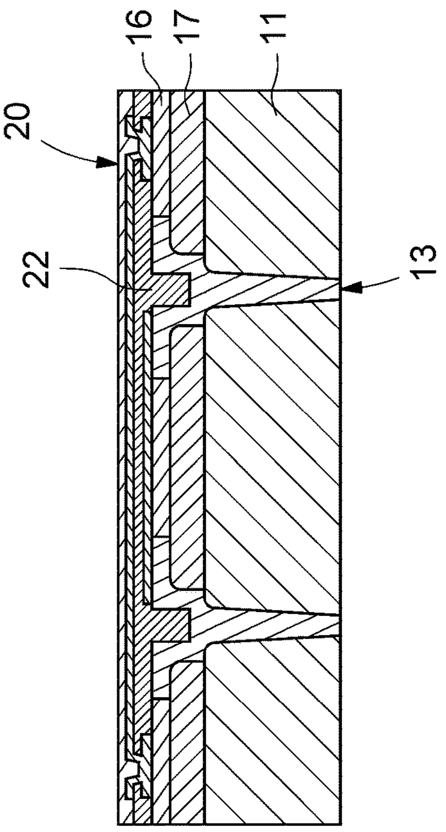

Referring to FIGS. 8*a* to 8*i*, the manufacturing method of a membrane probe card provided by a sixth preferred embodiment of the present invention also includes steps a) to e) as described in the first preferred embodiment, which involves providing a metal substrate 11 (as shown in FIG. 8*a*), laser processing to form through holes 12 (as shown in FIG. 8*f*), electroplating to form conductive bodies 13 within the through holes 12 (as shown in FIG. 8*g*), arranging a membrane wiring structure 20 (as shown in FIG. 8*h*), and removing the metal substrate 11 (as shown in FIG. 8*i*). The membrane device 10 of this embodiment is similar to that provided in the fifth preferred embodiment. The probe 30 also has a stepped base 32. However, in this embodiment, the stepped base 32 is formed by different way, resulting in slight differences in the manufacturing method, as detailedly described below.

As shown in FIG. 8*b*, after step a), upper and lower photoresist layers 18, 19 are formed on the upper and lower surfaces 111, 112 of the metal substrate 11 by using photolithography to define the positions of the bases 32 of the probes 30 by the upper photoresist layer 18. Then, as shown in FIG. 8*c*, a metal layer 17 is formed in the hollows of the upper photoresist layer 18 by using a metal material (such as copper) through electroplating, and thereafter remove the upper and lower photoresist layers 18, 19, as shown in FIG. 8*d*. In other words, the processes from FIG. 8*b* to FIG. 8*d* involve the formation of a metal layer 17 on the upper surface 111 of the metal substrate 11 by using photolithography and electroplating, with the metal layer 17 having multiple penetrating grooves 171, exposing the upper surface 111 of the metal substrate 11 through the penetrating grooves 171.

It is worth mentioning that in this embodiment, only one metal layer 17 is formed. However, it is also possible to laminate more metal layers on the metal layer 17 by using photolithography and electroplating multiple times, so that multiple metal layers collectively form a stepped penetrating groove.

As shown in FIG. 8*e*, step b) involves first forming an upper dielectric layer on the metal layer 17 and a lower dielectric layer 15 on the lower surface 112 of the metal substrate 11. The lower dielectric layer 15 is an anti-electroplating dry film attached to the lower surface 112 of the metal substrate 11, while the upper dielectric layer is formed by coating liquid dielectric material or bonding dielectric material film. The dielectric material can be a high-frequency dielectric material, such as polyimide. The upper dielectric layer is formed into a patterned dielectric layer 16 by exposure and development or dry etching in a way that the patterned dielectric layer 16 has multiple openings 161. Each opening 161 is communicated with one penetrating grove 171 of the metal layer 17 in a one-to-one manner, with the cross-sectional area of each opening 161 being larger than that of each penetrating groove 171.

As shown in FIG. 8*f*, step b) is to form through holes 12 in the metal substrate 11 through the openings 161 and penetrating grooves 171 by using laser processing. The penetrating grooves 171 are respectively communicated with the through holes 12 in a one-to-one manner, and the cross-sectional area of each penetrating groove 171 is greater than the cross-sectional area of each associated through hole 12. Additionally, as described in the first preferred embodiment, after step b), micro-etching processing can be performed. At this time, micro-etching can not only be performed on the through holes 12 to make the surface of the manufactured probe 30 smooth and conducive to stable testing but can also process the connection portion between the through hole 12 and the penetrating groove 171 into a round corner 115*a*, so that the connection portion 38*a* between the probe tip 33 and the base 32 of the completed probe 30 is concave and arc-shaped, or so-called fillet-shaped, as shown in FIG. 8*i*, thus avoiding stress concentration at the connection portion 38*a* and preventing breakage of the probe 30. Micro-etching can also process the connection portion between the penetrating groove 171 and the opening 161 into a round corner 115*b* (as shown in FIG. 8*f*), so that the probe portion formed by the round corner 115*b* (i.e., the connection portion 38*c* between the base layer 37*b* and the base layer 37*a* as shown in FIG. 8*i*) is concave and arc-shaped, or so-called fillet-shaped, thus avoiding stress concentration at the connection portion 38*c* and preventing breakage of the probe 30. In the case where a plurality of metal layers jointly form a stepped penetrating groove 171, the penetrating groove 171 will form a plurality of base layers with different cross-sectional areas of the probe base 32 (similar to the two base layers 37*a* shown in FIG. 7*i*). In this case, micro-etching can also process the sharp corners of the stepped penetrating groove 171 into round corners, so that the connection portions of the adjacent base layers formed thereby are concave and arc-shaped, or so-called fillet-shaped, thus avoiding stress concentration at those portions and preventing probe breakage.

As shown in FIG. 8*g*, step c) is to form conductive bodies 13 (material may be nickel, ruthenium, palladium-cobalt alloy, nickel-cobalt alloy, copper, etc.) in through holes 12 and associated penetrating grooves 171 and openings 161, so that each conductive body 13 includes a tip portion 133 inside the through hole 12 and a base portion 134 inside the penetrating groove 171 and the opening 161. In this embodiment, the conductive body 13 is not filled up with the penetrating groove 171 and the opening 161, so that the manufactured probe 30 has a space 36 similar to that shown in FIG. 6*c*. After the lower dielectric layer 15 is removed, a membrane wiring structure 20 is arranged, as shown in FIG. 8*h*. At this time, the trace 22 of the membrane wiring structure 20 can partially extend into the space inside the conductive body 13, which not only enhances the structural strength of the trace 22 but also protects the trace 22 by the probe base 32, thereby reducing the influence of stress on the trace 22.

Finally, step e) involves removing the metal substrate 11 and the metal layer 17 to form the membrane device 10 of the membrane probe card as shown in FIG. 8*i*. It is preferable that the metal substrate 11 and the metal layer 17 are made of the same material to facilitate the simultaneous removal of the metal substrate 11 and the metal layer 17 in this step. Furthermore, in step e) of the present invention, etching can be performed by using an alkaline amine copper etchant with a high etch selectivity ratio, which can avoid etching materials such as nickel, nickel-cobalt alloys, and palladium-cobalt alloys used in the probes. As shown in FIG. 8*j*, an anti-scratch layer 39 can be formed on the surface of the probe 30, with materials such as ruthenium. It should be noted that the formation sequence of the anti-scratch layer 39 here is not limited, for example, it can be formed by sputtering after the formation of the membrane device 10 as shown in FIG. 8*i* in step e). Alternatively, in step c) as shown in FIG. 8*g*, in the step of forming the conductive body 13 in each through hole 12 and its associated penetrating groove 171 and opening 161, the outer layer of the anti-scratch layer 39 can be electroplated first, followed by the formation of the inner layer structure, which is similar to the formation method of the structure shown in FIGS. 6*a* to 6*c*.

In this embodiment, by providing the metal layer 17 as shown in FIG. 8*d*, the completed probe 30 has a probe tip 33 and a base 32, and by providing the patterned dielectric layer 16 as shown in FIG. 8*e*, the patterned dielectric layer 16 becomes the surface dielectric layer 26 of the membrane wiring structure 20, and the base 32 of the probe 30 is partially embedded in the surface dielectric layer 26. These structural features are similar to those of the fifth preferred embodiment mentioned above, and their effects are not repeatedly illustrated here.

It is worth mentioning that the patterned dielectric layer 16 mentioned above can also be applied in cases where the metal layer 17 and its penetrating grooves 171, as shown in FIG. 8*f*, are omitted, and the recesses 113 formed on the upper surface 111 of the metal substrate 11, as shown in FIG. 7*e*, are omitted, for example, as the case shown in FIG. 1*b*. In this case, the patterned dielectric layer 16 can be formed on the upper surface 111 of the metal substrate 11, and the conductive body 13 can be formed inside the opening 161 of the patterned dielectric layer 16, thereby allowing the patterned dielectric layer 16 to become the surface dielectric layer 26 of the membrane wiring structure 20, and allowing the base 32 of the probe 30 to be embedded in the surface dielectric layer 26, achieving the same effect as the base 32 embedded in the surface dielectric layer 26 mentioned above.

Figures 9A, 9B, 9C, 9D, 9E:
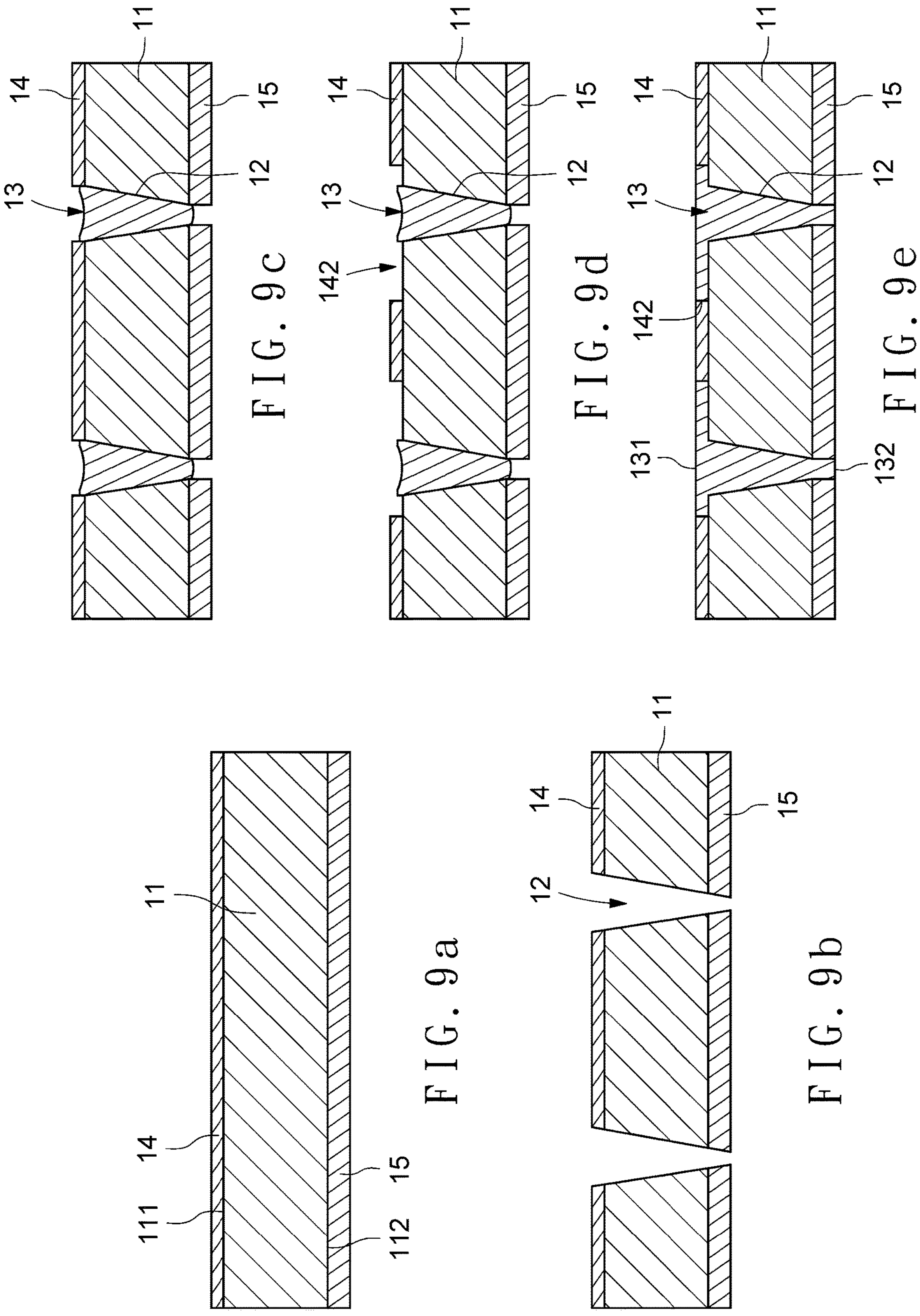
FIGS. 9*a* to 9*g* are schematic views showing the steps of a method of making a membrane probe card according to a seventh preferred embodiment of the present invention.
Figure 9F:
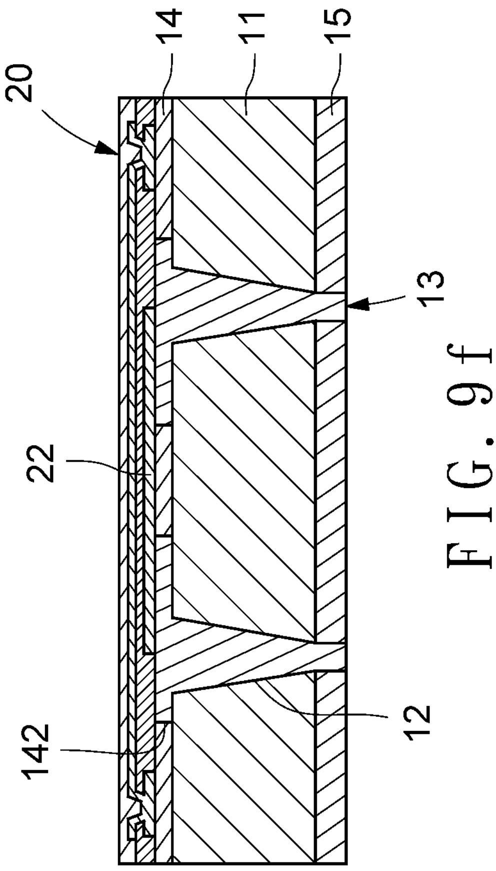
Figure 9G:
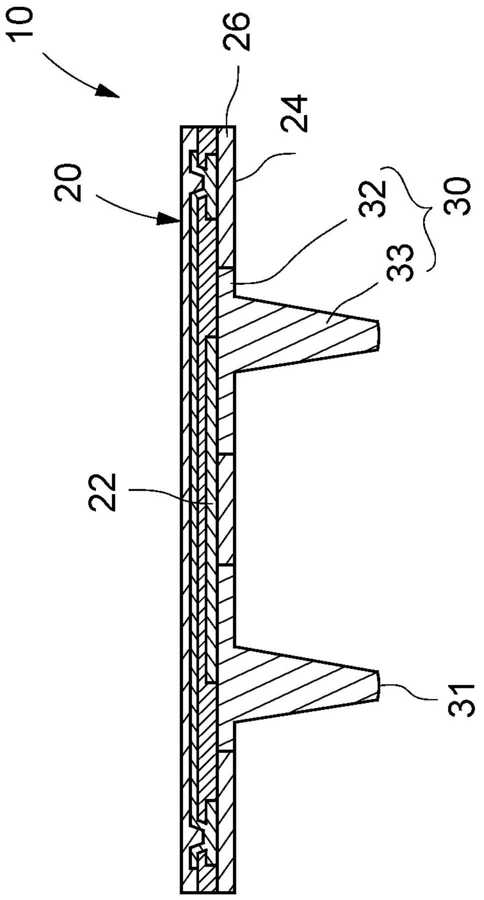

Referring to FIGS. 9*a* to 9*g*, the manufacturing method of a membrane probe card provided by a seventh preferred embodiment of the present invention is similar to the manufacturing method of the first preferred embodiment mentioned above, also including steps a) to e) such as providing a metal substrate 11 (as shown in FIG. 9*a*), laser processing to form through holes 12 (as shown in FIG. 9*b*), electroplating to form conductive bodies 13 in the through holes 12 (as shown in FIGS. 9*c* to 9*e*), arranging membrane wiring structure 20 (as shown in FIG. 9*f*), and removing the metal substrate 11 (as shown in FIG. 9*g*). However, this embodiment differs from the first preferred embodiment as follows.

As shown in FIG. 9*a*, in step b) of this embodiment, upper and lower dielectric layers 14, 15 are first provided on the upper and lower surfaces 111, 112 of the metal substrate 11, respectively, and then through holes 12 are formed in the metal substrate 11 by using laser processing. Each through hole 12 also penetrates through the upper and lower dielectric layers 14, 15, as shown in FIG. 9*b*. The upper and lower dielectric layers 14, 15 are formed by coating liquid dielectric material or laminating dielectric material film on the upper and lower surfaces 111, 112 of the metal substrate 11, and the dielectric material can be a high-frequency dielectric material such as polyimide. Providing upper and lower dielectric layers 14, 15 on the upper and lower surfaces 111, 112 of the metal substrate 11 can prevent problems such as bending or warpage of the metal substrate 11 during the manufacturing process.

As shown in FIG. 9*c*, step c) first partially forms the conductive bodies 13 by electroplating in each through hole 12 (materials may include nickel, ruthenium, palladium-cobalt alloy, nickel-cobalt alloy, copper, etc.). Then, as shown in FIG. 9*d*, dry etching or laser processing is used to enlarge the portions of each through hole 12 located in the upper dielectric layer 14 to form slots 142. Subsequently, as shown in FIG. 9*e*, other portions of the conductive bodies 13 (materials may include nickel, palladium-cobalt alloy, nickel-cobalt alloy, etc.) are formed by electroplating in each slot 142 and each through hole 12 located in the lower dielectric layer 15. Alternatively, the portions of each through hole 12 located in the upper dielectric layer 14 may be enlarged to form slots 142 before forming the conductive bodies 13.

As shown in FIG. 9*f*, the membrane wiring structure 20 is arranged. Then, portions of the lower dielectric layer 15 and the conductive bodies 13 located in the lower dielectric layer 15 are removed separately by using dry etching and grinding. Subsequently, high etching selectivity alkaline amine copper etchant is used to etch and remove the metal substrate 11, which can prevent erosion of materials of the probes made of nickel, nickel-cobalt alloy, palladium-cobalt alloy, etc. Thus, the membrane device 10 of the membrane probe card is completed, as shown in FIG. 9*g*.

As a result, the probe 30 formed by each conductive body 13 will have a probe tip 33 and a base 32 formed respectively in the through hole 12 and the slot 142, which can achieve the same effects as the probe 30 with the base 32 and the probe tip 33 as described above. Additionally, as described in the first preferred embodiment, after step b), micro-etching processing can be performed. At this time, micro-etching can not only be performed on the through holes 12 to make the surface of the manufactured probes 30 smooth and stable for testing, but also the connection portion between the through hole 12 and the slot 142 can be processed into round corner, so that the connection portion between the probe tip 33 and the base 32 of the manufactured probe 30 is concave and rounded, or so-called fillet shaped, thereby avoiding stress concentration at that portion of the probes 30 and preventing the probes 30 from breaking. Furthermore, upon completion of manufacturing, the upper dielectric layer 14 can serve as the surface dielectric layer 26 of the membrane wiring structure 20, and the base 32 of the probe 30 will be embedded in the surface dielectric layer 26, achieving the same effects as described above of embedding base 32 in the surface dielectric layer 26.

The membrane probe card of the present invention can be used for all probe tip sizes and pitches. Under specified requirements on fine pitch and probe tip height of the probes, using the methods provided in embodiments of the present invention can achieve optimal results. For example, the probe tips may be made having fine pitch less than 50 μm and the probe tip height of more than 50 μm. Under the fine pitch requirement, using laser processing on the metal substrate to form through holes can ensure that the probe tip pitch of the membrane probe card conforms to the specified standard value when the probes are formed on the membrane wiring structure, and at the same time, the probe tip height can also reach the specified standard value. After laser processing the metal substrate to form through holes, the method of the present invention further uses electroplating solution to form probe tips in the through holes by electroplating. In this step, the metal substrate will be immersed in the electroplating solution; however, because the metal substrate does not have water absorption characteristics, the dimension of the metal substrate will not change due to water absorption, thereby not affecting the stability of the size of the metal substrate. Specifically speaking, if laser processing is used on non-metallic substrates, such as substrates of photoresist, organic materials, etc., the substrate will absorb liquid, causing dimensional changes. When electroplating is performed to form probe tips, if the substrate will absorb liquid, the stability of the substrate size will be greatly affected, easily causing offset or misalignment of the position of the through hole of the substrate, and finally, the position where the probe tip is placed on the membrane wiring structure may not meet the accuracy requirement. As such, laser drilling and electroplating processes must be performed by using metal substrates.

In another aspect, the present invention provides a method of making a tested semiconductor chip by using a membrane probe card 100 shown in FIG. 10. The method comprises the steps of:

a) providing a membrane probe card 100 comprising the membrane device 10 provided by any of the above-disclosed embodiments of the present invention and/or made by any of the methods disclosed in the above-disclosed embodiments of the present invention;

b) contacting the conductive pads 220 of a semiconductor chip 240 under test with the probe tips 33 of the probes 30; and c) transmitting test signals to the semiconductor chip 240 under test via the membrane probe card 100 to test the semiconductor chip 240.

At last, it should be mentioned again that the constituent elements disclosed in the above embodiments of the present invention are only taken as examples for illustration, not intended to limit the scope of the present invention. The substitution or variation of other equivalent elements should be included within the scope of the following claims of the present invention.

What is claimed is:

1. A membrane probe card, comprising:

a membrane device, which comprises:

a membrane wiring structure comprising at least one trace and a probe protruding surface; and a plurality of probes disposed on the membrane wiring structure and protruding from the probe protruding surface, each of the probes defining a height axis, a length axis, and a width axis perpendicular to each other;

each of the probes comprising:

a base connected with the at least one trace of the membrane wiring structure and protruding from the probe protruding surface along the height axis by a first height, the base comprising a first side edge, a second side edge opposite to the first side edge, a tip placement section extending from the first side edge towards the second side edge along the length axis, and an extension section extending from the tip placement section along the length axis to the second side edge, the tip placement section defining a width in the width axis; and a laser-processed and electroplated probe tip, wherein the probe tip protrudes from the base along the height axis by a second height and is electrically connected with the at least one trace of the membrane wiring structure by the base, wherein the probe tip is located at the tip placement section of the base and includes a fixed end portion that is connected with the base and defines a width along the width axis in a way that the width of the tip placement section is greater than the width of the fixed end portion;

wherein each of the probes defines along the length axis a first distance from a center of the probe tip to the first side edge of the base and a second distance from the center of the probe tip to the second side edge of the base in a way that the first distance is less than the second distance, and wherein the base defines a width in the width axis and the trace connected with the base defines a width in the width axis in a way that the width of the base is greater than the width of the trace.

2. The membrane probe card of claim 1, wherein the extension section of the base of each of the probes comprises a tapered section; the tapered section has a width gradually reduced from the tip placement section towards the second side edge.

3. The membrane probe card of claim 2, wherein the extension section of the base of each of the probes has two rounded corners at the second side edge.

4. The membrane probe card of claim 1, wherein a connection portion between the base and the probe tip of each of the probes is concavely arc-shaped; the base of each of the probes comprises a plurality of base layers; cross-sectional areas of the base layers in the length axis and the width axis are different, and a connection portion between two of the base layers is concavely arc-shaped.

5. The membrane probe card of claim 1, wherein the membrane wiring structure comprises a surface dielectric layer including the probe protruding surface; the base of each of the probes includes an inner embedded portion embedded in the surface dielectric layer, and an outer exposed portion protruding outside the surface dielectric layer; cross-sectional areas of the inner embedded portion in the length axis and the width axis are greater than cross-sectional areas of the outer exposed portion in the length axis and the width axis; the inner embedded portions of adjacent two of the probes are separated by the surface dielectric layer.

6. The membrane probe card of claim 1, wherein the probe tip of each of the probes has a contact end face farthest from the base, and the contact end face is flat.

7. The membrane probe card of claim 1, wherein the trace connected with the base of each of the probes extends from the second side edge of the base; the first side edge of the base defines a width in the width axis; the second side edge of the base of each of the probes defines a width in the width axis in a way that the width of the second side edge is smaller than the width of the first side edge; the width of the fixed end portion of the probe tip is greater than the width of the trace.

8. The membrane probe card of claim 1, wherein each of the probes comprises an outer layer exposed outside and at least one inner layer shielded by the outer layer; the outer layer and the at least one inner layer are made of different metals, and extend from the probe tip to the base; each of the at least one inner layer of each of the probes has a solid structure or a space located inside the at least one inner layer.

9. The membrane probe card of claim 1, wherein the probe tips of the probes are formed separately in a plurality of laser processed through holes of a metal substrate; a pitch between adjacent two of the probe tips is less than 50 μm, and the second heights of the probe tips are greater than 50 μm.

10. The membrane probe card of claim 1, further comprising a circuit board and a probe seat mounted to the circuit board; wherein an elastic structure is provided inside the probe seat, and the membrane wiring structure is mounted to the probe seat and electrically connected with the circuit board.

* * * * *